(12) United States Patent
Pozzuoli et al.

(10) Patent No.: US 7,443,054 B2
(45) Date of Patent: Oct. 28, 2008

(54) ENVIRONMENTALLY HARDENED ETHERNET SWITCH

(75) Inventors: Marzio Paride Pozzuoli, Kettleby (CA); Xiaoyu Xie, Scarborough (CA)

(73) Assignee: Ruggedcom Inc., Woodbridge, Ontario (CA)

( * ) Notice: Subject to any disclaimer, the term of this patent is extended or adjusted under 35 U.S.C. 154(b) by 0 days.

(21) Appl. No.: 11/892,262

(22) Filed: Aug. 21, 2007

(65) Prior Publication Data
US 2008/0049458 A1 Feb. 28, 2008

Related U.S. Application Data

(63) Continuation of application No. 11/168,352, filed on Jun. 29, 2005, now Pat. No. 7,276,814, which is a continuation-in-part of application No. 10/330,148, filed on Dec. 30, 2002, now abandoned.

(51) Int. Cl.
*H02J 1/00* (2006.01)
*H02H 9/00* (2006.01)

(52) U.S. Cl. .......................... 307/77; 361/56

(58) Field of Classification Search ............. None
See application file for complete search history.

(56) References Cited

U.S. PATENT DOCUMENTS

| | | | | |
|---|---|---|---|---|
| 5,768,117 A | * | 6/1998 | Takahashi et al. | 363/65 |
| 6,288,916 B1 | * | 9/2001 | Liu et al. | 363/37 |
| 6,314,009 B1 | * | 11/2001 | Dittmer et al. | 363/65 |
| 7,276,812 B2 | * | 10/2007 | Uhl | 307/61 |

* cited by examiner

*Primary Examiner*—Michael J Sherry
*Assistant Examiner*—Adi Amrany

(57) ABSTRACT

A circuit for an Intelligent Electrical device (IED) is disclosed. Using this circuit, the IEDs can be used in harsh industrial environments, such as those present in power utility substations. The circuit may comprise a dual stage isolated power supply. The dual stage isolated power supply has a first DC to DC converter for converting received power from the received voltage to an intermediate voltage. The intermediate voltage is then further converted to a voltage which can be used by the Ethernet IED. Each of the DC to DC converters also provide galvanic isolation and also transient suppression and electromagnetic interference filtering to decrease adverse electrical effects which may be inherent in the power received from an external source. The first and second DC to DC converter provides a first level of galvanic isolation which is greater than the second level of galvanic isolation provided by the second DC to DC converter. A third level of isolation is provided at each port of each IED to protect the internal components of the IEDs from other IEDs connected to it. The circuit can be used in any IED, such as Ethernet switches.

21 Claims, 14 Drawing Sheets

ENVIRONMENTALLY HARDENED ETHERNET SWITCH

This application is a continuation application of application Ser. No. 11/168,352 filed Jun. 29, 2005, now U.S. Pat. No. 7,276,814, which is a continuation-in-part of application Ser. No. 10/330,148 filed Dec. 30, 2002, now abandoned.

FIELD OF THE INVENTION

The present invention relates in general to the field of computer communication networks and specifically to Ethernet switching hubs (Ethernet Switch) suitable for use in harsh industrial environments such as those found in electric power utility substations.

BACKGROUND OF THE INVENTION

Trends in the electric power utility automation sector, specifically substation automation, have been driving towards common communications architecture. The initiative was begun in the early 1990s driven by the major North American utilities under the technical auspices of Electric Power Research Institute (EPRI). The resulting standard that emerged is known as the Utility Communications Architecture 2.0 (UCA2). At the heart of this architecture is the substation LAN (Local Area Network) based on Ethernet. However, one of the major requirements for electronic devices used in substations as part of a protection and control system is their ability to operate reliably in harsh environmental conditions. Harsh environmental conditions include conditions having both adverse atmospheric conditions and adverse electrical conditions. Substation environments are much harsher than the office environments where the overwhelmingly majority of Ethernet equipment resides and was designed for.

It would therefore be desirable for the Ethernet switch, which forms the backbone of the substation LAN, to be as reliable and robust as other IEDs (Intelligent Electronic Devices) designed specifically to operate in harsh substation environments. One such group of IEDs are protective relays which perform the function of protecting the power system from fault conditions and other anomalies. Modern, microprocessor based protective relays are adhering to the UCA2 standard and providing one or multiple Ethernet ports ready to connect to suitable Ethernet Switches.

However, the prior art Ethernet switches and some other electronic devices do not meet these standards. In order for prior art switches and other electronic devices to be as reliable and robust as the protective relaying IEDs and other electronic devices, they must generally adhere to ANSI/IEEE C37.90 standards (US) and the IEC60255 standard (Europe) which were designed for protective relaying IEDs and other intelligent devices found in electrical substations. In particular, it would be desirable to Ethernet switches to pass the following electrical and atmospheric type tests:

(A) Electrical Environment
  1. Surge Withstand Capability as per ANSI/IEEE C37.90.1 (1989), namely withstanding 2.5 k Voscillatory transients, 4.0 kV fast transients applied directly across each output, input and power supply circuit.
  2. Surge Immunity as per IEC 61000-4-5 (1995 Level 4) standards.
  3. High Frequency Noise Disturbance as per IEC 60255-22-1 (1988 Class III) standards.
  4. Fast Transient Disturbance as per IEC 60255-22-4 (1992 Class IV) standards, namely withstanding 4 kV, 2.5 kHz applied directly to the power supply inputs and 4 kV, 2.5 kHz applied directly to all other inputs.
  5. Dielectric Withstand as per ANSI/IEEE C37.90-1989 and IEC 60255-5: 1977 standards.
  6. High Voltage Impulse Test as per IEC 60255-5: 1977 standard.
  7. Electrostatic Discharge as per IEC 60255-22-2: 1996 Class 4 and Class 3 standards.
  8. Radiated Radio Frequency Immunity as per IEEE C37.90.2 and IEC 61000-4-3 standards.

(B) Atmospheric Environment
  1. Temperature: Cold at −40° C. as per the IEC 60068-2-I standard and dry heat at 85° C. as per IEC 60068-2-2 standard.
  2. Temperature Cyclic: −25° C. to +55° C. as per IEC 60255-6 (1998) standard.
  3. Relative Humidity: 5 to 95% as per the IEC 60068-2-2 standard.

Referring now to FIG. 1A, an electronic circuit block diagram, shown generally by reference numeral 10, of a conventional commercial Ethernet Switch is shown. The circuit 10 consists of an Ethernet Media Access Controller (MAC) block I which typically provides a plurality of communications ports each adhering to the Reduced Media Independent Interfaces (RMII) signaling specification as put forth by the version 1.2 of the RMII Consortium. These RMII ports interface to a physical layer device 4, referred to as a PHY, which converts the RMII signals to differential transmit and receive signal pairs in accordance with the IEEE 802.3 10BaseT and or 100BaseTX standards. These signals are then noise filtered by the filter block 5a and electrically isolated via pulse transformers 5b which also couple the signals to the RJ45 style connector receptacles 5c which are typical of commercial grade Ethernet Switches. The RJ45 interface 8 typically accepts TIA/EIA 568 category 5 (CAT-5) unshielded twisted pair copper wire cables. Power is typically provided by a single power supply block 6 and cooling of the electronics is also typically provided by a low-voltage DC powered cooling fan 7 typical of those found in personal computers.

The electronic circuit 10 illustrated in FIG. 1A has numerous shortcomings when used in a harsh environment including a utility substation environment. In particular, the switch is susceptible to electrical transients and electromagnetic interference being coupled into the device via twisted pair copper cables 8. This is extremely undesirable since it could result in corruption of real-time mission critical control messages being transmitted over the network via the switch. Moreover, actual damage to the switch itself is possible if high voltage electrical transients are directly coupled into the device via the copper cables overcoming the limited electrical isolation (typically 1000V to 1500V RMS) provided by isolation transformers 5b. Another point of electrical transient susceptibility in the design of FIG. 1A is the power supply input 6a. The power supply block 6 must be capable of enduring electrical transients at levels of 2 kV to 5 kV as specified by the ANSI/IEEE C37.90 and IEC 60255 standards. This is not a requirement for commercial grade Ethernet Switches and thus the power supply inputs 6a do not provide suitable transient suppression circuitry. Furthermore, commercial grade Ethernet switches are not specifically designed to withstand EMI (Electromagnetic Interference) levels of 35V/m as specified by ANSI/IEEE C37.90.2 (1995) which is typical of many substation environments.

Accordingly, conventional circuit 10 suffers from the disadvantage that it is susceptible to electrical transients and electromagnetic interference at levels which are possible, or even common, in utility substation environment. The design of FIG. 1A is also susceptible to mechanical breakdown because of the use of rotating cooling fan 7 required to cool the electronic components. Thus the reliability of the Ethernet Switch is determined by the reliability of the fan which is the only moving mechanical part in the design and typically has the lowest Mean-Time-Between-Failures (MTBF) value, such as less than 10,000 Hrs, compared to electronic components which have MTBF values of greater than 450,000 Hrs. It would be highly desirable to eliminate the fan block 7 from the design and improve the reliability of the Ethernet Switch to MTBF levels similar to those of the IEDs, which would be connected to it, namely greater than 450,000 Hrs. Furthermore, the typical operating temperature range of commercial Ethernet Switches having the circuit 10 shown in FIG. 1A is 0° C. to 40° C. (ambient) with fan cooling 7. However, the operating temperature range for devices in the substation environment such as protective relays is specified by the IEC 60255-6 (1998) standard as −25° C. to +55° C. Therefore, not only is the circuit 10 of FIG. 1A susceptible to failure, it also does not meet the requirements of the environmental conditions which are possible, or even common, in utility substation environments.

Furthermore, because of the mission critical nature of the application, that being the use of the substation LAN to send real-time control messages during power system fault conditions, the availability or "up time" of the Ethernet Switch is critical to proper operation of the protection and control system. A further point of susceptibility of the design of FIG. 1A is the power supply block 6. If the power supply block 6 fails then the Ethernet Switch fails and is not available to provide the backbone of the LAN during the critical period of time where the protection and control system needs to respond in the order 4 to 100 ms.

One potential communication equipment fault which may arise, particularly in, but not exclusively in electric utility substations, includes a ground potential rise (GPR). While communication equipment in electric utility substations, and other harsh environments, must be capable of withstanding high levels of electromagnetic interference caused by a variety of phenomenon, one particular phenomenon which occurs in such harsh environments occur for instance when a high voltage (for example 500 kV or higher) conductor experiences a ground fault condition, such as being shorted to earth ground. In this type of phenomenon, ground currents will flow that can create high levels of ground potential rise (GPR) within a localized area, such as a switch yard in the case of an electric utility substation, may occur. Because the Ethernet switches and other IEDs may be located in a network that covers a large area, a ground potential rise within one location may have catastrophic effects to the components in that area and/or the components in other areas. For instance, any equipment with copper wire connections across the location of the ground potential rise, such as, for example, an Ethernet switching hub located in the control room connecting to a protective relay device or intelligent switch gear device in a switch yard, will experience high levels of ground potential rise which can damage the equipment by causing the galvanic isolation barriers between the two connected devices, such as the Ethernet switch in the control room and the protective relay in the switch yard, to break down. In this way, the internal components of the electronics could be exposed to high voltages and currents causing potential physical damage. For communication equipment interfacing using electrical connections such as by copper wire, or a combination of electrical connections and fibre optical media, and/or a single electrical connection using copper wire or other conductive material, any ground potential rise presents a serious concern.

FIG. 1B illustrates a ground potential rise in a network 150 comprising a conventional Ethernet switch 102 and end device 120 (which may be an intelligent electrical device or merely an electrical device "which does not have a microprocessor") in one embodiment of conventional devices 102, 120. As illustrated in FIG. 1B, which, for illustrative purposes only, relates to a substation environment, the Ethernet switch 102 having a connection to ground A is physically located, for instance, by a cable 110 from an end device 120. The end device 120 is connected to ground B, which is a distance of up to 100 m from ground A. In the case of a ground potential rise with respect to either ground A or ground B, such as may occur when a high voltage conductor experiences a ground fault condition, such as being shorted to ground, a ground potential rise could be created at either ground A or ground B. In this situation, electrical transients in the form of a ground potential rise can exceed 5 kV during ground faults in harsh environments, such as substation environments. Equipment, such as Ethernet switch 102 and end device 120 which are connected by an electrically conductive connection, such as cable 110, but separated by a sizeable distance, can experience high potential differences across their respective Ethernet ports 104, 114. These potential differences can exceed the typical rating of isolation 106, 116 for conventional Ethernet ports 104, 114, respectively, which is typically 1200 Volts Root Mean Square ($V_{RMS}$). In this situation, the galvanic isolation in excess of 4000 $V_{RMS}$ would generally be required in order to prevent physical damage to the Ethernet equipment, such as dielectric breakdown of the internal components of the Ethernet switch 102 and/or end device 120. It is also apparent that such damage could occur at a critical time, thereby damaging the overall network precisely when communication is most critical.

Other major requirements for electronic devices used in substations as part of a protection and control system is reliable operation during periods of high electromagnetic interference (EMI). Substation environments can have multiple phenomena, which generate high levels of EMI (as shown for instance in Table 1 below).

TABLE 1

Table 1: EMI Phenomena in the Substation - Sources and Causes, Corresponding IEC and IEEE Type Tests

| Electromagnetic Phenomena | Sources and Causes | Corresponding IEEE 1613 Type Test | Corresponding IEC 61850-3 Type Test |
|---|---|---|---|
| AC voltage dips, short interruptions and voltage variations | Faults and switching in the power supply network | | IEC 61000-4-11 |

TABLE 1-continued

Table 1: EMI Phenomena in the Substation - Sources
and Causes, Corresponding IEC and IEEE Type Tests

| Electromagnetic Phenomena | Sources and Causes | Corresponding IEEE 1613 Type Test | Corresponding IEC 61850-3 Type Test |
| --- | --- | --- | --- |
| DC voltage dips, short interruptions | Power supply fault and switching, lack of battery charging | | IEC 61000-4-29 |
| Ripple on d.c. power supply | AC rectification, battery charging | | IEC 61000-4-17 |
| Conducted disturbances in the range d.c. to 150 kHz (including the power frequency) | Induction from industrial electronics, filters leakage current, fault current at the power frequency, etc. | | IEC 61000-4-16 |
| Surge 100/1 300 □s | Blowing of fuses | | IEC 61000-4-5 |
| Surge 1.2/50 □s-8/20 □s | Fault in power network, lightning | | IEC 61000-4-5 |
| Surge 10/700 □s | Effect of lightning on telecommunication lines | | IEC 61000-4-5 |
| Oscillatory waves: ring wave | Switching phenomena, indirect effect of lightning | | IEC 61000-4-12 |
| Fast transient/burst | Switching of reactive loads, relay contact bouncing, switching in SF$_6$ | IEEE C37.90.1 | IEC 61000-4-4 |
| Oscillatory waves: damped oscillatory wave | HV switching by isolators | IEEE C37.90.1 | IEC 61000-4-12 |
| Conducted disturbances, induced by radio-frequency fields | Radiation by radio-frequency emitters | | IEC 61000-4-6 |
| Electrostatic discharge | Discharge of static electricity by operator, furniture, etc. | IEEE C37.90.3 | IEC 61000-4-2 |
| Power frequency magnetic field | Current in power circuits, earth circuits and network | | IEC 61000-4-8 |
| Pulse magnetic field | Lightning current in earth conductors and network | | IEC 61000-4-8 |
| Damped oscillatory magnetic field | MV and HV switching by isolators | | IEC 61000-4-8 |
| Radiated, radio-frequency electromagnetic field | Radiation by radio-frequency emitters | IEEE C37.90.2 | IEC 61000-4-3 |

Since the substation local area network LAN is becoming an integral part of the protection and control system it would therefore be desirable for the Ethernet switch, which may form the backbone of the substation LAN, to be as reliable and robust as the IEDs (Intelligent Electronic Devices) which have been specifically designed to operate reliability in harsh substation environments and which connect to the Ethernet switch (i.e. the substation LAN). One such class of devices are known as protective relaying IEDs. As such, it would be desirable for the switch to have the same level of immunity to EMI as the protective relaying IEDs. In more recent years, both the EEC and IEEE (Institute of Electrical and Electronics Engineers) have issued international standards (IEC 61850-3 2002, IEEE 1613 2003 dated Aug. 12, 2003) to specifically address the EMI immunity requirements of communications networks and systems in substations.

SUMMARY OF THE INVENTION

It is the object of the present invention to provide an improved method and device for suppression of electrical interference in electrical devices, including Ethernet switches, which at least partially overcomes the above-mentioned disadvantages of existing devices. In addition, it is an object of this invention to provide an improved method and device to suppress electrical interference of a power supply used to power an electrical device in harsh industrial environments including those found in electric power utility substations.

Accordingly, in one aspect, the present invention resides in a network having at least two Intelligent Electronic Devices (IEDs) with at least one electrical connection between at least two IEDs in the network, a power supply for providing power from an external source to internal components of an associated IED of the at least two IEDs, said power supply circuit comprising: a power input connection for receiving power from the external source at a received voltage with respect to ground; a first DC to DC converter for converting the power from the received voltage to an intermediate voltage and providing a first level of isolation for the internal components of the IED a second DC to DC converter for receiving power from the first DC to DC converter at the intermediate voltage and converting the power from the intermediate voltage to an internal voltage to be used by the internal components of the associated IED, and, providing a second level of electrical isolation to the internal components of the IED and providing a second level of electrical isolation for the internal components of the IED; and wherein the first level of isolation is greater than the second level of isolation to protect the internal components of the IED from adverse electrical effects.

In a further aspect, the present invention resides in a network having at least two Intelligent Electronic Devices (IEDs), said network having at least one electrical connection between the at least two IEDs, a method for providing power from an external source to internal components of an associated IED of the at least two IEDs, said method comprising: receiving power from the external source at a received voltage with respect to ground; at a first DC to DC converter, converting the power from the received voltage to an intermediate voltage and providing a first level of isolation to the internal components of the IED; at a second DC to DC converter, receiving power from the first DC to DC converter at the intermediate voltage and converting the power from the intermediate voltage to an internal voltage to be used by the internal components for the associated IED, and, providing a second level of electrical isolation to the internal components of the IED; and wherein the first level of isolation is greater than the second level of isolation to protect the internal components of the IED from adverse electrical effects.

In a further aspect, this invention resides in an Ethernet switch for use in an electrical power utility substation, a transient suppression device for suppressing electrical interference to a power supply of the Ethernet switch, said device comprising: an input connectable to the external power connector; an output connectable to a power input for the Ethernet switch; at least one varistor connected in parallel with the input and output; at least one tranzorb connected in parallel across the input and output; at least one capacitor connected in parallel with the input and output.

One advantage of the present invention is that the circuit for use in the Ethernet Switch has a high degree of resistance to electrical transient effects and electromagnetic interferences. In particular, the circuit provides transient suppression of electrical signals entering into the power supply. This is accomplished in a preferred embodiment by using a combination of transzorbs, metal oxides varistors, and one or more capacitors A further advantage of the present invention is that the power supply circuit can provide immunity for electromagnetic interference phenomenon from entering the power port which is typical of substation environments. For instance, several substation environments may be susceptible to the electromagnetic interference phenomenon set out in Table 1 above. The power supply circuit may facilitate or assist in suppressing electrical transients entering through the power port allowing for substantially "error free" communications in accordance with IEEE 1613 hereby incorporated herewith by reference during the application of EMI immunity type tests.

In a further aspect, the present invention provides a power supply circuit having increased immunity to ground potential rise (GPR) for Ethernet ports communicating via copper cable or indeed any type of electronic devices in a network which are separated by substantial distances such as more than 10 or 20 metres, and which have at least one electric connection between them. Such ground potential rises have been discussed above and illustrated in FIG. 1B and are decreased or at least can provide increased isolation of up to 6,000 $V_{RMS}$ between a ground potential rise at one electronic device in a network with respect to another IED in the network.

Communications equipment and electric utility substations should generally be capable of operating reliably in hot environments without the use of cooling fans. New standards such as IEEE 1613 recommend the following ranges:

−40 to +70° C.
−30 to +65° C.
−20 to +55° C.

Nevertheless, many manufacturers specify a range of −40 to +85° C. It is also crucial to note that safety approvals from regulatory bodies such as CSA or UL generally require input voltages above 72 V DC for the maximum power dissipation at the maximum rated temperature. For example, a power supply with a power output of 25 watts and an operating temperature of −40 to +85° C. would have to obtain CSA/UL 60950 safety approval at the maximum temperature of +85° C. when delivering the maximum output of 25 watts. This is one of the criteria which the power supply circuit of the present invention was intended to achieve.

A further advantage of the present invention is that, by having the electrical isolation, such as in the form of the first DC to DC converter and the second DC to DC converter, located between the external power source and the internal components, rather than between the ports with respect to each of the IEDs in the network, less isolation is required in the switch as a whole because clearly there will be more ports or electrical connections into an IED than power connections to ground. This decreases the overall cost of the system. Moreover, having electrical isolation in each port would greatly increase the heat generated by the IED.

One of the greatest sources of heat and power dissipation in communications equipment is most often the power supply. Thus, reducing power dissipation and removing the heat from the power supply component is highly desirable. Since cooling fans are not recommended generally because the rotating mechanical parts are the most prone to failure, cooling methods, such as employing thermoelectric cooling (TEC) to cool specific electronic components such as microprocessors and laser diodes have been employed in the past. However, their use increases the load on the power supply since they require power in order to create the mechanical movement of the fan or to create the thermoelectric effect. The additional load on the power supply may be significant and therefore negates the benefits of cooling a particular component since the overall power consumption of the system increases in order to accommodate the TEC power requirements. That is to say, use of the TEC may defeat the purpose of cooling a power supply component since the TEC requires power in order to perform the cooling and such power must also generate heat. A further advantage of the present invention is by having a first DC to DC converter and then a second DC to DC converter, the two DC to DC converters can be located at different areas upon the casing of the electric device. This permits the entire metal casing of the IED to act as a heat sink. In a preferred embodiment, the power/heat dissipation from the two separate converters is such that no thermoelectric cooling or mechanical cooling such as fans are required while the power supply circuit can still deliver up to 25 watts of power over an ambient temperature of −40° C. to +85° C.

Communications equipment and electric utility substations are preferably capable of being powered from a variety of different DC battery and AC line sources with the following nominal values: 110V DC substation battery, 125V DC substation battery, 250V DC substation battery all with respective ranges of ±20% of nominal, as well as 110V AC (60 Hz) and 220V AC (50 Hz) each with a range of ±20%; A device that could accommodate all of the above nominal values and their respective ranges with one power supply circuit would have to accommodate an input range of: 88-300V DC and 88-264V AC. In the past, manufacturers of conventional devices have addressed the problem of different external sources of power by providing several different power supply circuits often one for each of the above nominal values and associated ranges. The users in these cases would have to specify the range and or nominal value beforehand. It is still common practice for the users to specify between DC and AC. Therefore, the conventional systems suffer from a disadvantage in that the wide variety of nominal values and resultant larger ranges of an external source were not easily accommodated for by the switches or other IEDs. A further advantage of the present invention is by having a first DC to DC converter and then a second DC to DC converter, the two DC to DC converters can be located at different areas upon the casing of the electric device. This permits the entire metal casing of the IED to act as a heat sink. In a preferred embodiment, the power/heat dissipation from the two separate converters is such that no thermoelectric cooling or mechanical cooling such as fans are required while the power supply circuit can still deliver up to 25 watts of power over an ambient temperature of −40° C. to +85° C.

A further advantage of the present invention is that by having the first DC to DC converter and the second DC to DC converter separated, the first DC to DC converter can be more easily designed to accept both alternating current (such as 50 or 60 Hz) and also DC battery of voltages accommodating voltages from 88 to 375 V DC and 85 to 264 V AC. This is preferable because communications equipment in harsh environments, such as electric utility substations, are preferably capable of being powered from a variety of different sources. These would include DC batteries with the most common nominal voltages being 110 V DC (UK), 125 V DC (North America) and 250 V DC (Europe). Once tolerances are taken into consideration, the resultant voltage range which the power and supply circuit for the IED must accommodate is 88 to 300 V DC. Similarly, AC line voltages have two nominal voltages, such as 110 V AC at 60 Hz (North America) and 220 V AC at 50 Hz (Europe) such that one's tolerances are taken into consideration, the resultant voltage range the power supply circuit for the IED must accommodate is 88 to 264 V AC. By having a first and second DC to DC converter, wider ranges of both AC and DC external power sources can be accommodated making the resulting power circuit more robust and the same power circuit can be used in North America, Europe and other locations where corresponding power is supplied.

Further aspects of the invention will become apparent upon reading the following detailed description and drawings which illustrate the invention and preferred embodiments of the invention.

BRIEF DESCRIPTION OF THE DRAWINGS

In the drawings, which illustrate embodiments of the invention.

DETAILED DESCRIPTION OF THE INVENTION

A preferred embodiment of the present invention and its advantages can be understood by referring to the present drawings. In the present drawings, like numerals are used for like corresponding parts of the accompanying drawings.

Figure 2:
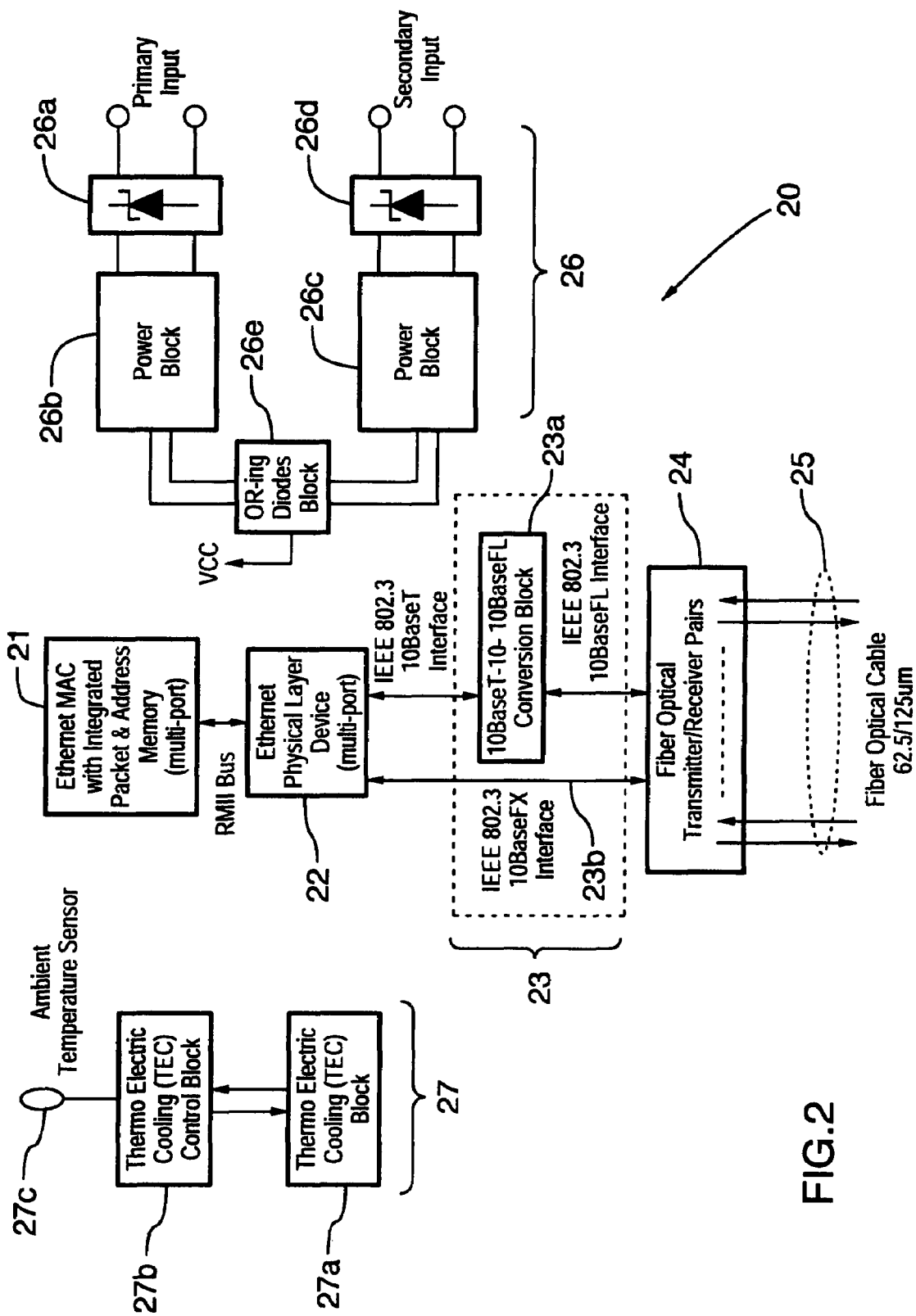
FIG. 2 shows a block diagram showing an electrical circuit for use in an Ethernet Switch according to one embodiment of the present invention.

FIG. 2 illustrates an electronic circuit block diagram shown generally by reference numeral 20, for an Ethernet switch according to one embodiment of the present invention. The circuit consists of an Ethernet Media Access Controller (MAC) block 21 with integrated packet and address memory which provides a plurality of communications ports each adhering to the RMII (Reduced Media Independent Interfaces) signaling specification as put forth by the version 1.2 of the RMII Consortium. Such a block 21 may be implemented using Marvell 88E6050 or a Galileo GT48350.

These RMII ports interface to a multi-port physical layer device 22, referred to as a PHY, which converts the RMII signals to differential transmit and receive signal pairs in accordance with the IEEE 802.3 10BaseT and or 100BaseTX standards. The PHY portion of the circuit can be implemented by an AMD (Advanced Micro Devices) Am79C875 quad PHY device which is capable of industrial grade (i.e. −40 to 85° C.) operating temperature.

For 10 Mbps operation the differential 10BaseT signal pairs interface to a 10BaseT-to-10BaseFL conversion block 23 which will convert the 10BaseT differential signal pairs to current drive signals capable of driving fiber optical LED transmitters 24 and interfacing to LED fiber optical receivers 24 with outputs as low as 2 mVp-p and a dynamic range of 55 dB. A Micro Linear ML4669 or ML6651 may implement the 10BaseT-to-10BaseFL conversion block. Versions of these components are available which will operate at industrial grade temperatures.

The output signals of the 10BaseT-to-10BaseFL conversion block interface directly to the fiber optical transmitter and receiver pairs 24. These may be implemented by Agilent Technologies (Trade Mark) HFBR-2416 and HFBR-1414 receiver and transmitter component pair. These components are capable of industrial grade operating temperatures.

For 100 Mbps operation the PHY devices 22 chosen for the present embodiment of the invention are capable of directly interfacing 23b to 100 Mbps fiber optical transceivers 24 with Pseudo Emitter Coupled Logic (PECL) interfaces that are compliant with the 100BaseFX version of the IEEE 802.3u standard. The 100 Mbps fiber optical transceivers may be implemented using Agilent Technologies HFBR-5903 (Trade Mark) or other similar fiber optical transceiver.

Figure 1A:
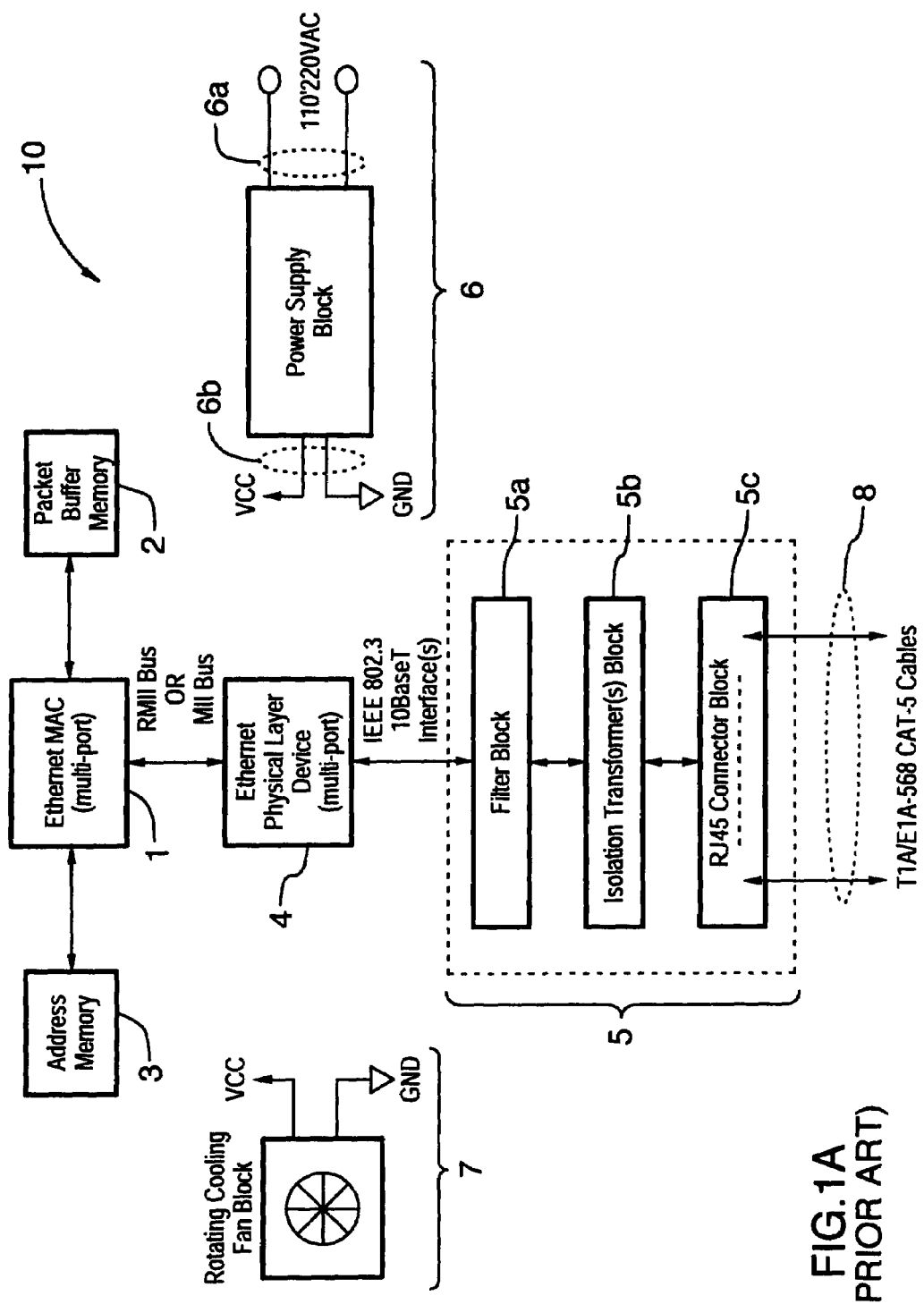
FIG. 1A shows a block diagram showing an electric circuit used in a conventional Ethernet Switch.
Figure 1B:
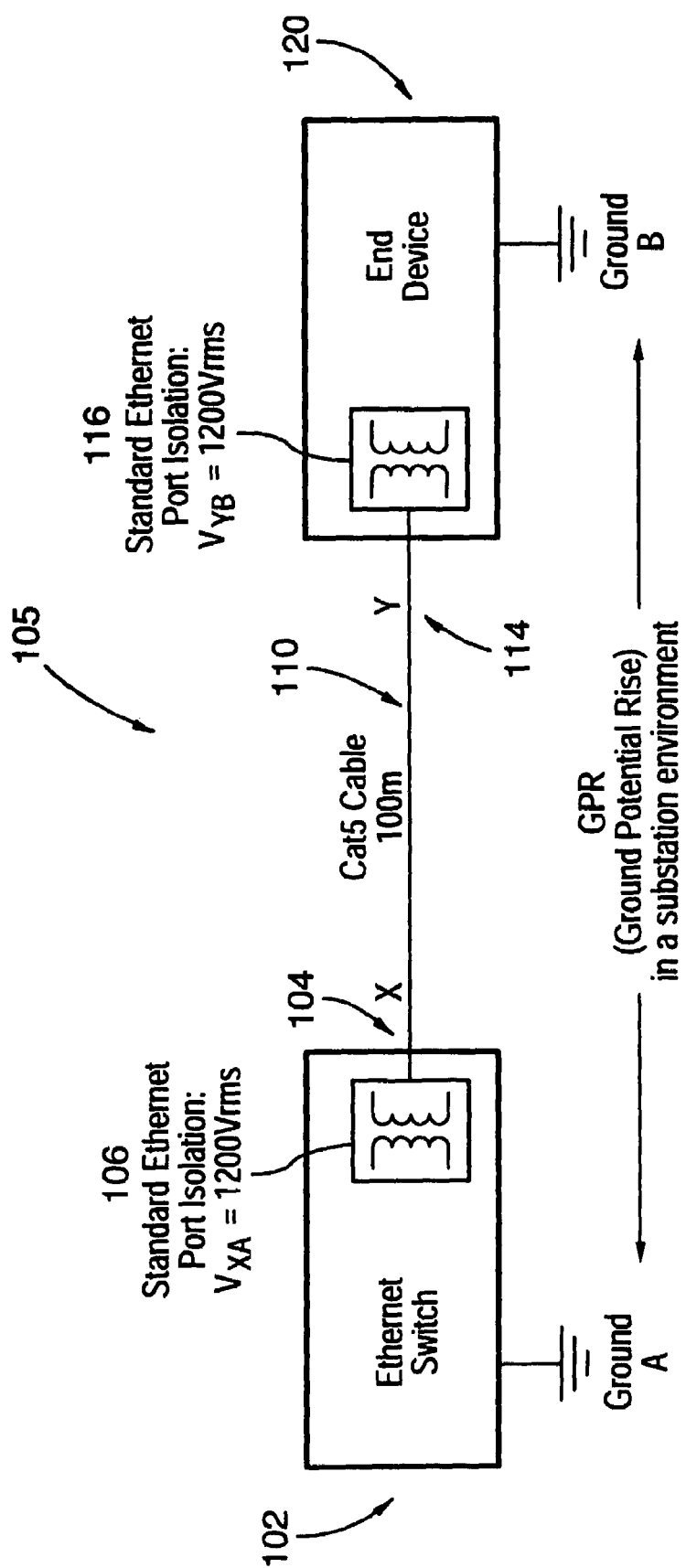
FIG. 1B shows the effects of a ground potential rise in a conventional Ethernet switch.

It should be appreciated that by using a fiber optical communications medium that the system is less susceptible to electrical transients and electromagnetic interference being coupled into the device as is the case with the twisted pair copper cables 8 of FIG. 1. However, it is common to use at least some twisted copper cables 8 as well as fiber optic communications medium in a network. In some embodiments, IEDs may be mixed copper 8 and fiber optic medium connections.

Regulated DC voltages suitable for operating the electronics are supplied to the system via dual redundant power supplies 26. Transient suppression 26a for power supply block #1 26b is provided at the inputs. The same transient suppression 26d is provided for power supply block #2 26c.

Figure 3:
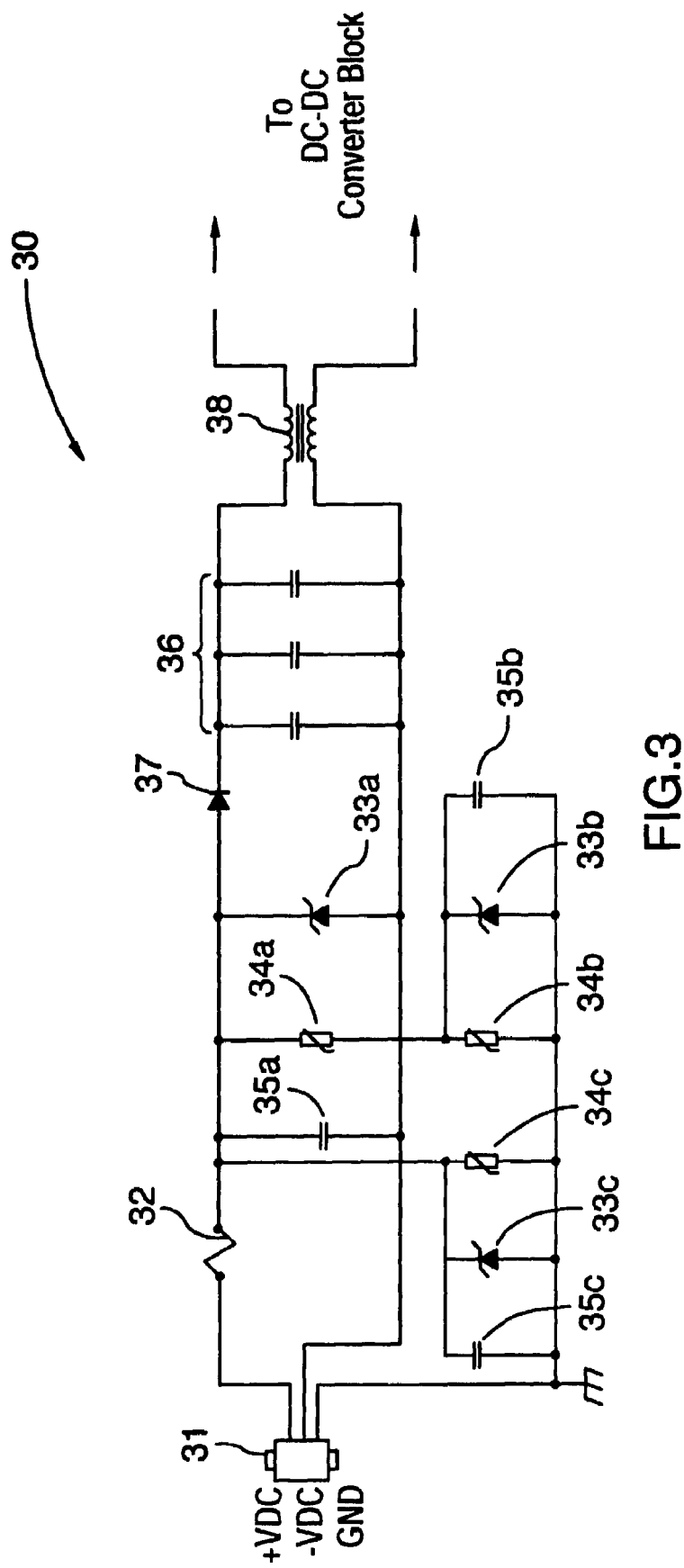
FIG. 3 shows a schematic diagram of a transient suppression circuit used in one aspect of the present invention.

Referring now to FIG. 3, a detailed schematic diagram of the transient suppression circuit 26a, 26d used in the present embodiment of the invention is shown generally by reference numeral 30. Voltage transients entering via the external, power connector 31 are filtered back to their source by capacitors 35a, 35b and 35c which provide a high frequency bypass for both differential and common mode noise transients. To ensure that transients with high voltage levels do not exceed the ratings of components such as the bypass capacitors 35a, 35b and 35c, Transzorbs 33a, 33b, and 33c and Metal Oxide Varistors (MOVs) 34a, 34b and 34c are used to clamp both differential and common mode high-voltage transients to acceptable levels. These components must be rated with high instantaneous peak-power dissipation capacity. This capacity may be provided by ST Microelectronics TRANSIL components or General Semiconductor's TransZorb components which are capable of dissipating 400 W to 1.5 KW for a period of 1 ms. Suitable MOV components may be selected from Harris Corporation's ZA series.

It should be appreciated that the present embodiment of the invention allows for either Transzorbs 33 or MOVs 34 as a voltage clamping device depending on what type of failure mode is desired for these components. Tanszorbs 33 will "fail short" when parameters are exceeded while MOVs 34 will "fail open" (i.e. open circuit) when parameters are exceeded. Failing open allows the system to continue functioning but now leaves the remaining circuitry in its path unprotected. Failing short will halt the remainder of the system and typically cause the short circuit fuse 32 to blow thereby isolating the system 30 from any further damaging transients. The blocking rectifier diode 37 is used to prevent the application of a reverse polarity voltage source at the input power connector 1. Capacitor bank 36 provides further differential mode filtering while common mode choke 38 provides further common mode filtering of any remnants of noise or harmful electrical transients which have made it passed the initial bypass capacitors 36 and the Transzorb 33 or MOV 34 clamping devices. Suitable values for the capacitor bank 36 capacitors are 680 nF/1 OOV ceramic capacitors manufactured by KEMET. Suitable values for the common mode choke are 1.2 mH per leg as manufactured by EPCOS. Preferably, the transient suppression circuit 30 shown in FIG. 3 is sufficient to pass the electrical transients type tests as defined by the following standards:

1. Surge Withstand Capability as per ANSI/IEEE C37.90.1 (1989) standards.
2. Surge Immunity as per IEC 61000-4-5 (1995 Level 4) standards.
3. High Frequency Noise Disturbance as per IEC 60255-22-1 (1988 Class 111) standards.
4. Fast Transient Disturbance as per IEC 60255-22-4 (1992 Class IV) standards.
5. High Voltage Impulse Test as per IEC 60255-5: 1977 standard.

Referring back to FIG. 2, the outputs of power supply block #1 26b and power supply block #2 26c are electrically OR-ed via the OR-ing diodes block 26e. The system 20 has been designed such that should power supply block #1 fail then all of the required current to drive the system will be provided by power supply block #2 and vice-versa. According to one embodiment, each of power supply 26a, 26b comprise a high efficiency DC-DC converter such as that provided by Artesyn's EXB30 which has an operating efficiency of 92% and an operating temperature of −40 to 85° C. The high efficiency is generally advantageous as it ensures dissipation within the system's enclosure is minimal. It should be appreciated that the use of dual redundant power supply blocks in the system 20 improves the system reliability and availability.

Cooling for components requiring cooling to maintain their case temperatures below the manufacturer's recommended operating limit may be accomplished, according to one embodiment, via the thermoelectric cooling block 27. The cooling block 27 comprises a thermoelectric cooler (TEC) 27a, which is controlled by an electronic control block 27b, and a temperature sensor 27c is mounted on the components requiring cooling. The control block 27b performs the function of measuring the ambient temperature inside the enclosure of the operating unit via the temperature sensor 27c, comparing it to predefined limit such as 70° C. and upon the ambient temperature reaching the limit the control block 27b applies power to the TEC. A control block of this type can be implemented via a National Semiconductor LM26 Factory Preset Thermostat designed to be mounted on printed circuit boards for use in microprocessor thermal management systems. The LM26 integrates the temperature sensor 27c and the measurement and control block 27b in a package capable of operating over a temperature range of −55 to 110° C. Beyond this predetermined range, or other ranges, the control block 27b applies a current to the TEC 27a.

Figure 4:
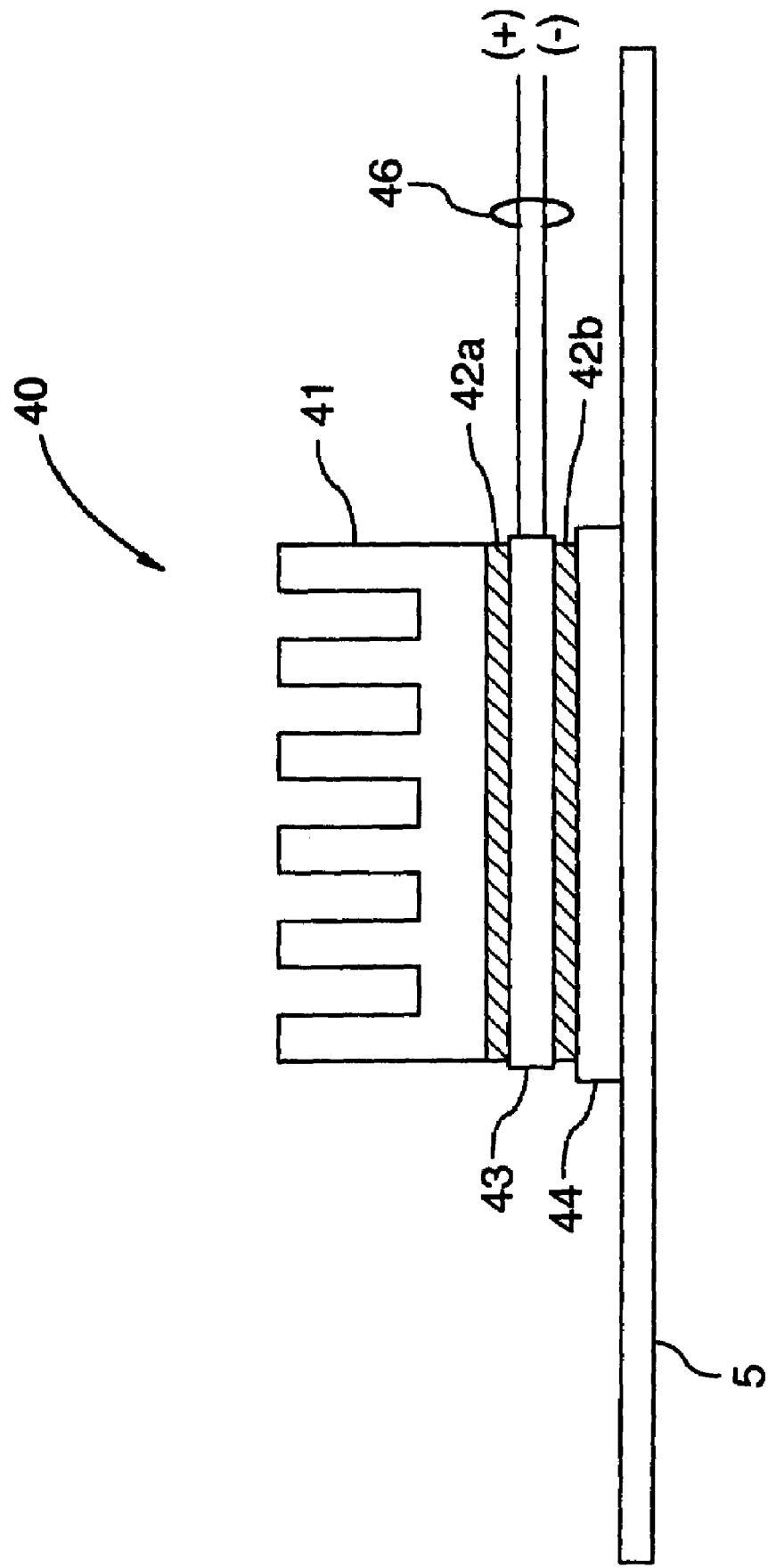
FIG. 4 shows a diagram detailing the application of a Thermoelectric Cooler (TEC) device to an electronic component such as a microprocessor.

FIG. 4 shows a diagram of the application of TEC 43 to an electronic component such as a microprocessor on a printed circuit board 45 according to one embodiment. The TEC itself 43 is mounted in between the component 44 and the heat sink via layers of thermal epoxy 42a, 42b. A DC current to power to the TEC 43 is delivered via wired leads 46 and controlled via the TEC control block 27b of FIG. 2. A plurality of TECs 43 may be applied in the present embodiment of the invention to components requiring cooling. It should be appreciated that by eliminating the need for cooling fans and thus rotating mechanical parts typically found in cooling fans, the reliability and thus the applicability of the system has been improved.

Figure 5:
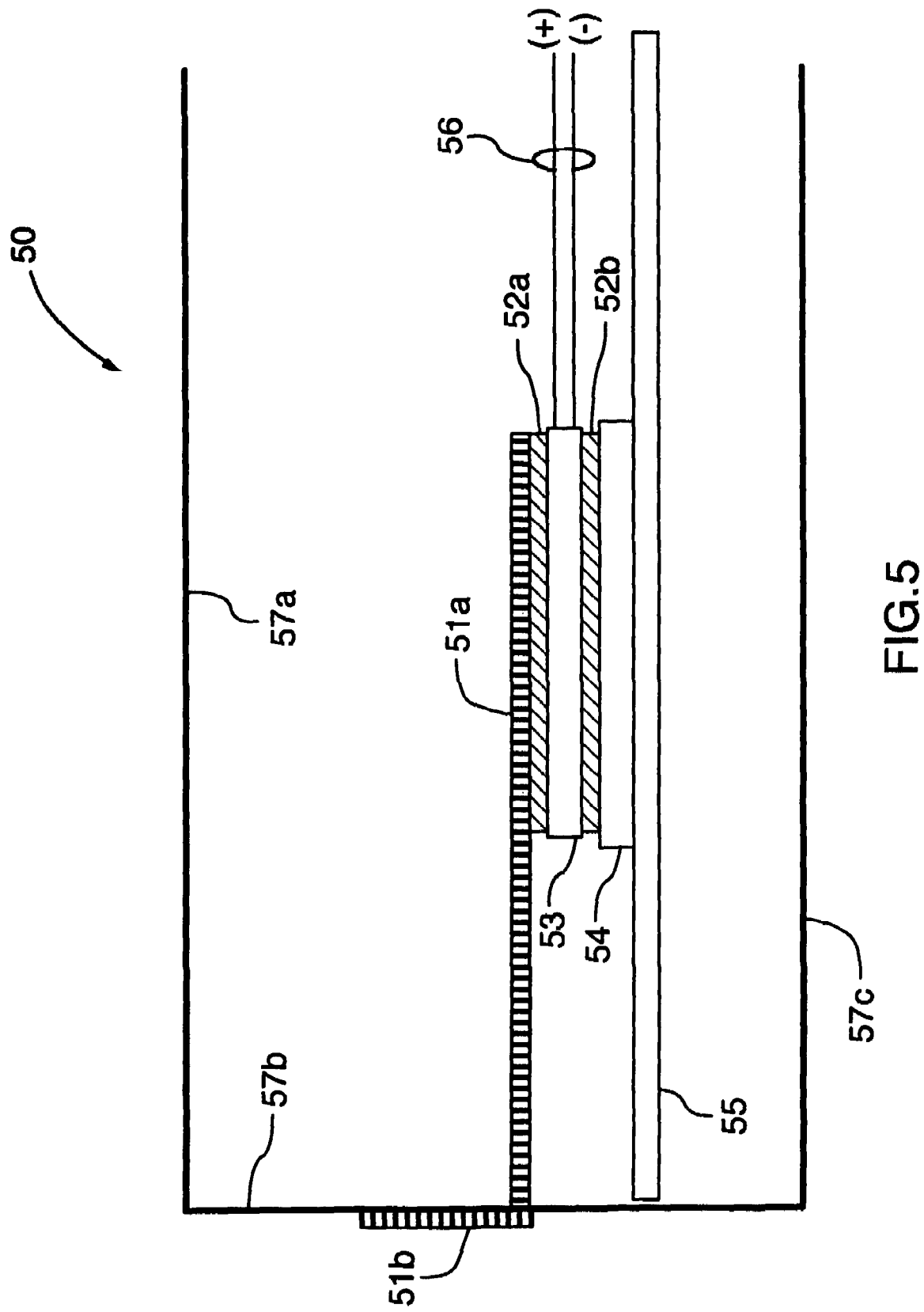
FIG. 5 shows a diagram detailing the application of Thermoelectric Cooler (TEC) device to an electronic component using an extended heat sink with an external surface according to one aspect of the present invention.

FIG. 5 illustrates use of a TEC 53, according to a further embodiment, to an electronic component using an extended heat sink 51a with an external surface 51b. In some embodiments of the invention the heat sink 51a is mounted on the TEC 53 via thermal compound 52a and the external surface 51b extends outside of the metallic enclosure 57b. It should be appreciated that this heat sink arrangement allows heat to be conducted outside of the enclosure 57c and dissipated via convection to the outside ambient environment.

Figure 6:
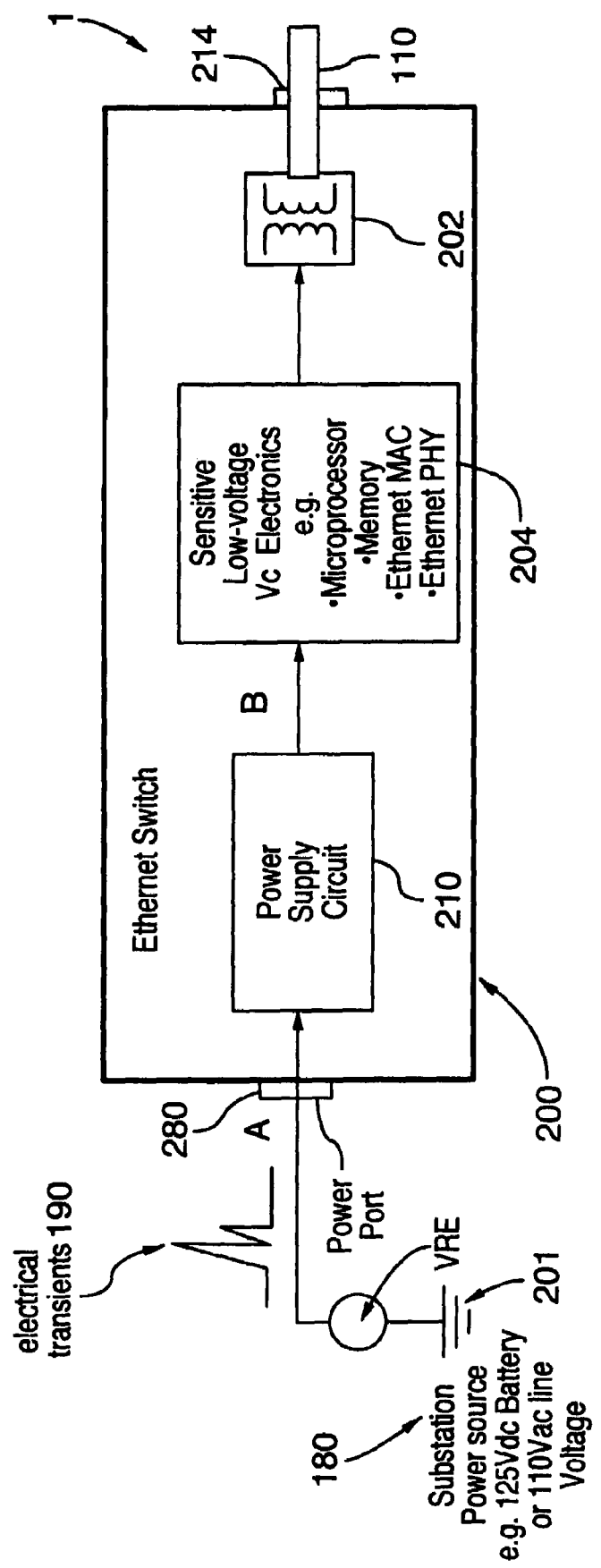
FIG. 6 illustrates a symbolic representation of an intelligent electrical device (IED) comprising a power supply circuit according to one embodiment of the present invention.

FIG. 6 illustrates a further embodiment of the present invention consisting of a power supply circuit 210 used in an intelligent electronic device (IED), shown generally by reference numeral 200. The IED 200 in FIG. 6 is an Ethernet switch 220, but it is understood that the power supply circuit 210 may be used in other types of IEDs as well.

As illustrated in FIG. 6, the IED 200 may have at least one electrical connection 214 for connecting the IED through a network 150 to other IEDs in the network. In addition to the electrical connection, the IED may also have one or more fiber optic connections (not shown in FIG. 6).

The electrical connection 214 may have a port isolation circuit 202 for connection to the cable 110 providing a level of isolation between the internal components 204 of IED 200 and the internal components of another IED (not shown) in the network 150. Preferably, the IED 200 will have a number of ports, some of which may be electrical connections 214 and others may be ports for other types of media, such as fiber optic media. Preferably, there will be a standard isolation circuit 202 at each electrical connection.

Reference numeral 204 illustrates generally the internal components of the IED 200, in this case the Ethernet switch 220. For instance, the internal components 204 may comprise any type of internal components which generally are sensitive low voltage electronics and may include a microprocessor, memory, Ethernet MAC, Ethernet PHY, and any other types of internal components for performing the functions of the specific IED 200.

Power may be supplied to the IED 200 from an external power source 180. The external power source 180 will provide power generally and the received voltage VRE with respect to the ground 201. It is understood that the ground 201 will be the ground at the physical location of the IED 200. As discussed above, in the case of a ground potential rise, the ground 201 at the location of the IED 200 may vary from the ground at another IED.

Furthermore, other electrical transients, as shown generally by reference numeral 190, may also be present in the external power source 180. A power input connection, as shown generally by the power port 280, receives power from the external power source at the received voltage VRE with respect to ground 201. The power supply circuit 210 converts the received power from the received voltage VRE to a voltage Vc which can be used by the internal components 204. In a preferred embodiment, the power supply 210 also provides electrical isolation from adverse electrical effects, including electrical transients 190 and ground potential rise as described below.

Figure 7:
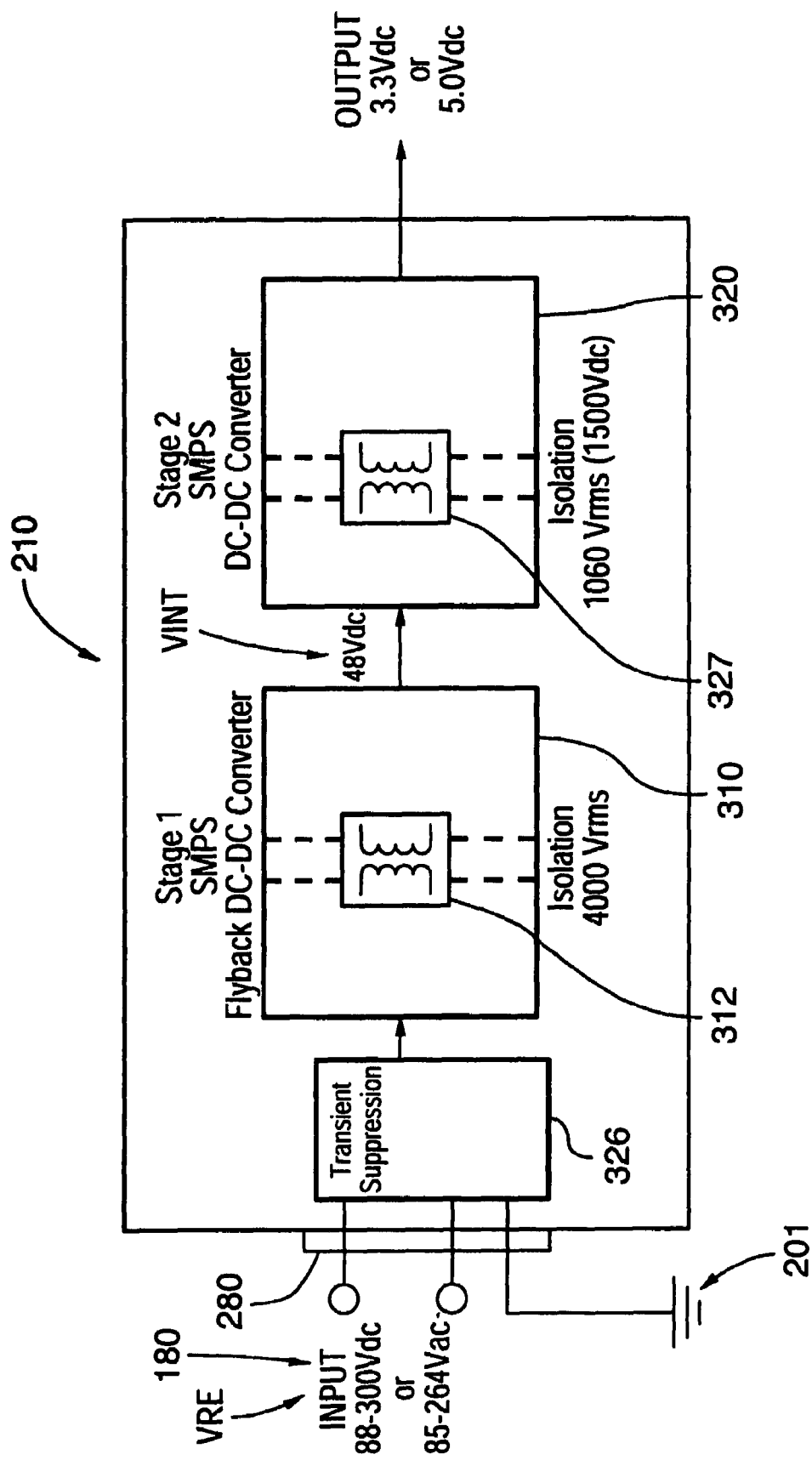
FIG. 7 illustrates a symbolic diagram of the power supply circuit used in FIG. 6 according to one embodiment of the present invention.

FIG. 7 is a block diagram showing the power supply circuit 210 in more detail according to one preferred embodiment of the present invention. As illustrated in FIG. 7, power supply circuit 210 has a power input connection 280 for receiving the power from the external source at the received voltage VRE which, in this embodiment, may be between 88 to 300 volts DC or 85 to 264 volts AC with respect to ground 210. The power supply circuit 210, in one preferred embodiment, comprises a transient suppression circuit, shown generally by reference numeral 326, which initially suppresses transient effects 190. In one preferred embodiment, the transient suppression circuits 326 may be similar to the transient suppression circuit 326 shown in FIG. 3 discussed above. In any case, the transient suppression circuit 326 is connected between the power input connection 280 and the first stage DC to DC converter 310 for suppressing transient signals 190 in the power received from the external source 180. The first DC to DC converter 310 converts the power from the received voltage VRE to an intermediate voltage VINT. As illustrated in FIG. 7, in a preferred embodiment, the intermediate voltage VINT is about 48 volts DC. Preferably, the intermediate voltage VINT is any range between 30 volts DC and 60 volts DC and more preferably between 44 volts DC and 52 volts DC.

The power supply circuit 210 also comprises a second stage or second DC to DC converter 320. The second DC to DC converter 320 receives the power from the first DC to DC converter 310 at the intermediate voltage VINT and converts the power from the intermediate voltage VINT to an internal voltage Vc which can be used by the internal components of the associated IED 200. As illustrated in FIG. 7, the voltage of internal components Vc may be about 3.3 volts DC or about 5 volts DC. It is understood that the internal component Vc may be any appropriate voltage for the internal component 204 of the IED 200.

In addition to converting the power from the received voltage VRE to the intermediate voltage VINT, the first DC to DC converter 310 preferably also provides a first level of isolation for the internal components 204 from the external power source 180. In particular, it is preferred if the first DC to DC converter 310 provides a first level of isolation to the internal components 280 by comprising a transformer 312 or other type of magnetic energy storage device which provides galvanic isolation of about 3,000 to 5,000 volts $V_{RMS}$ and, more preferably about 4,000 $V_{RMS}$, between the external power source 180 and the internal components 280. Similarly, in a preferred embodiment, the second DC to DC converter 320 provides a second level of electrical isolation to the internal components 280 of the IED 200 from the external power source 180. In a preferred embodiment, the second DC to DC converter 320 also comprises the second transformer 322, or any other type of magnetic energy storage device, to provide galvanic isolation between the external power source 180 and the internal components 280. Preferably, the second DC to DC converter 320 provides the second level of galvanic electrical isolation of about 900 to 1,200 $V_{RMS}$ and more preferably about 1,060 $V_{RMS}$ as illustrated in FIG. 7.

It will be appreciated from the above discussion and also as illustrated in FIG. 7 that the first level of isolation of the first DC to DC converter 310 is greater than the second level of isolation of the second DC to DC converter 320. This is the case for a number of reasons including because this generally will mean that the first transformer 312 is larger than the second transformer 322 thereby permitting the drop in voltage from the received voltage VRE to the intermediate VINT to be greater than the drop in voltage from the intermediate voltage VINT to the internal component voltage Vc. In this way, more efficient operation of the overall device can be accomplished by having an initial larger drop to a lower voltage such as by decreasing heat generation. Furthermore, by the first level of isolation being greater than the second level of isolation, the first DC to DC converter 310 may be adapted to more safely absorb adverse, electrical effects. Also, even if the first DC to DC converter 310 fails as a result thereof, the second DC to DC converter 320 may provide a final fail safe level of isolation to the internal components 204. In this way, the internal components 280 could be protected against a catastrophic event, and the IED 200 may be powered through an alternate power source and/or more easily salvaged for use in other IEDs 200.

As indicated above, in a preferred embodiment, the first DC to DC converter 310 may comprise a transformer 312. While this can be accomplished by any type of DC to DC converter 320 which comprises a transformer, the first DC to DC converter 310 is preferably a fly back switch mode power supply type DC to DC converter as is known in the art. Similarly, in a preferred embodiment, the second DC to DC converter is also a fly back switch mode power supply type DC to DC converter. Alternate types of DC to DC converters 310, 320, which may be used without deviating from the present invention, including a forward converter and any other DC to DC converter which comprises a transformer or other device which depend on their operation or energy stored in a magnetic field and do not have an electrical connection between the input circuits, (external power source 180) and the output circuits (internal components 204).

Figure 8:
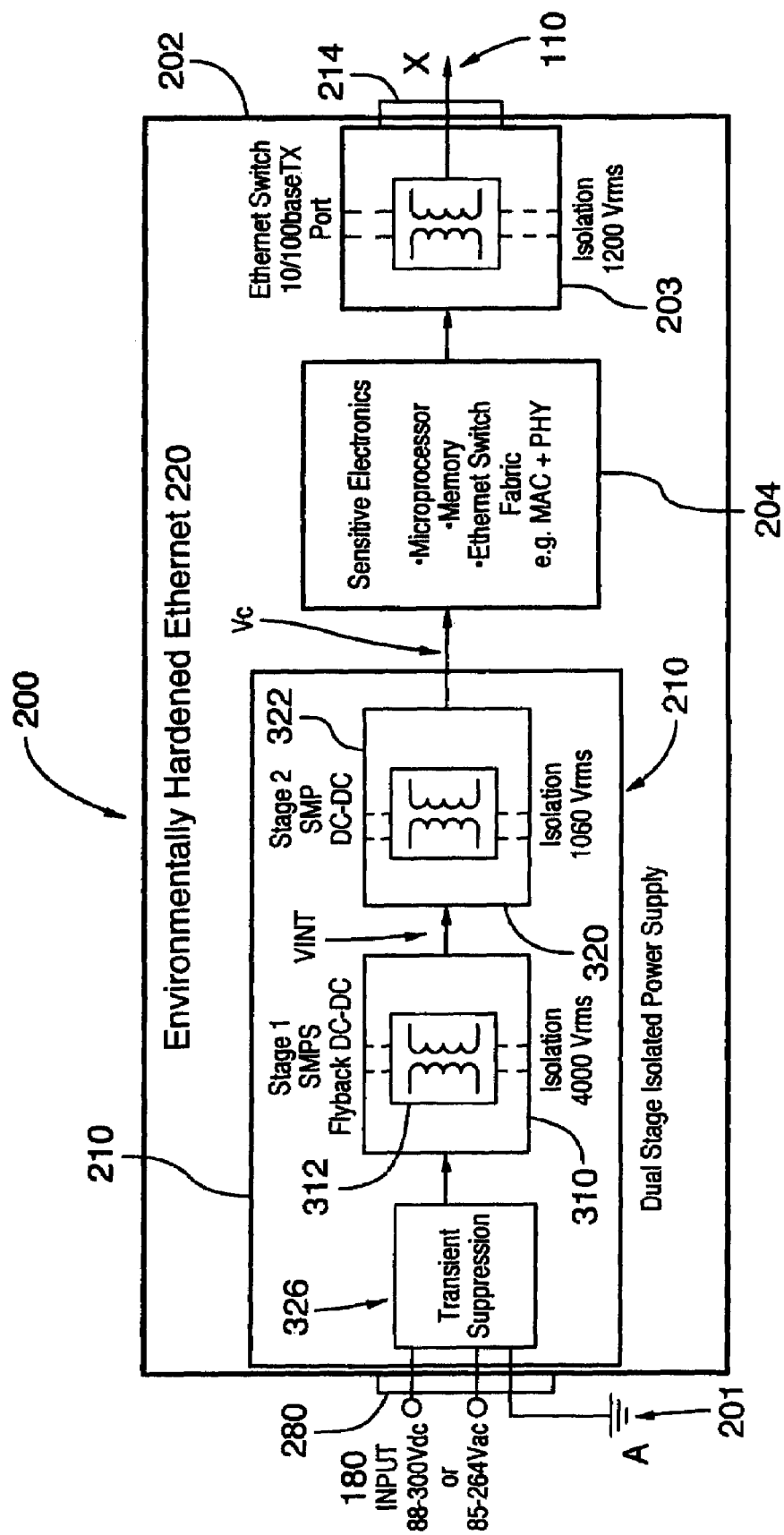
FIG. 8 illustrates a symbolic representation of an intelligent electrical device (IED) comprising a power supply circuit according to one embodiment of the present invention in more detail.

FIG. 8 illustrates an IED 200 showing the power supply circuit 210 in more detail. In particular, the power supply circuit 210 is dual stage isolated power supply circuit 210 as discussed in FIG. 7 above which provides galvanic isolation of 4,000 $V_{RMS}$ (first DC to DC converter 310) and 1,060 $V_{RMS}$ (second DC to DC converter 320) thereby providing a total of 5,060 $V_{RMS}$ galvanic isolation to the internal components 204. Accordingly, the IED 200 illustrated in FIG. 8 provides a total of about (4,000 $V_{RMS}$+1,060 $V_{RMS}$+1,200 $V_{RMS}$=) 6,260 $V_{RMS}$ galvanic isolation between the external electrical connection 214 and the external power source 180 and in particular ground 201 at location A. It is understood that if the IED 200 has more than one electrical connection 214, there will be additional port isolation circuits 202.

Preferably, the port isolation circuit 202 is an Ethernet switch 10/100 base TX port providing galvanic isolation of about 1,200 $V_{RMS}$ as illustrated in FIG. 8 having a port isolation transformer 203. It will be appreciated that in order to increase the galvanic isolation of the internal components 204, the port isolation circuit 202 could be increased such that the galvanic isolation may increase above 1,200 $V_{RMS}$ to 3,000 or 4,000 $V_{RMS}$. This can be done, for instance, by increasing the size of the port isolation transformer 203. However, it is understood that this may increase the cost and complexity of the IED 200. Moreover, there will generally be a port isolation circuit 202 associated with each electrical connection 214 and a typical IED 200 may have 2, 4, 8 or up to 16 electrical connections 214, requiring a corresponding port isolation circuit 202 for each electrical connection 214. This can increase the cost of the overall IED 220 if the galvanic isolation increases above, for instance, 1,200 $V_{RMS}$ or 1,500 $V_{RMS}$. Moreover, the port, isolation circuit 202 will generate more heat, which must be dissipated, as the galvanic isolation increases. Therefore, it has been appreciated that increasing the isolation provided by the power supply circuit 210, of which there will generally only be one, or two if a backup circuit is used in certain embodiments, greatly decreases the overall cost as well as the overall heat generation for the IED 200. Moreover, by increasing the galvanic isolation provided by the power supply circuit 210, the overall total galvanic isolation provided between the external connection 214 and the external power source 180 can be increased as outlined above.

It will be understood that the IED 200 will be connected through point X in FIG. 8 to another IED 200 in the network 150. Preferably, at least the other IED 200, and more preferably, all of the electrical devices connected to the network 150, will have comparable power supply circuits 210 providing comparable galvanic isolation. In this way, each of the IEDs 200 in the overall network 150 can be protected against adverse electrical effects.

For instance, in the case of ground potential rise, such as a conductor short circuit to point A, namely ground 201 for the IED 200 shown in FIG. 8, the ground 201 may increase by several kilovolts. It is understood that the other IEDs (not shown) in the network 150 connected to the electrical connection 214 may be several tens of meters or hundreds of meters away from the point A at ground 201, and, given the natural electrical insulation of the earth, the ground at the other IEDs (not shown) may not increase. This will provide an inherent ground potential rise at point A affecting ground 201 with respect to grounds of other IEDs in the system. Such a ground potential rise may pass through the transient suppression circuits 326 because it is not in the form of a transient effect, but rather a direct current increase in the actual value of the ground 201. However, because of the galvanic isolation provided by the first DC to DC converter 310 and the second DC to DC converter 320, the power supply circuit 240 according to a preferred embodiment of the present invention will provide galvanic isolation of up to 5,000 volts $V_{RMS}$ thereby protecting the internal components 204 against a ground potential rise up to 5,000 $V_{RAMS}$. Moreover, the overall IED 200 will also provide galvanic isolation of approximately at least 6,000 volts $V_{RMS}$ from the power input connection 280 to the electrical connection 214. In this way, the ground potential rise occurring at point A of ground 201 will be isolated from the overall network 150 by up to 6,000 volts $V_{RMS}$ thereby protecting other components in the network 150 also. This can be crucial in order to protect each of the IEDs 200 connected to the network 150 during a time critical event at any one location, such as a conductor short at point A. Clearly, while communication along the network 150 is always important, communication during a time critical event is particularly crucial and therefore it is advantageous to design the network 150 and the power supply circuits 210 of the electrical devices on the network 150 to survive critical events, such as a ground potential rise, caused, for instance, by a high voltage power line conductor shorting to ground.

Furthermore, because the power supply circuit 210 comprises a first DC to DC converter 310 and a separate second DC to DC converter 320, it is possible to have these two converters 310, 320 thermally separated in the IED 200. Therefore, one further advantage of having a dual stage isolated power supply 210 is that the components dissipating the most amount of heat or power, such as the DC to DC converters 310, 320 can be thermally mounted at separate locations on the metal case 400 of the IED 200. This allows a larger surface area of the metal case 400 of the IED 200, in this case the Ethernet switch 220 can be used as a heat sink. Furthermore, separating the components which dissipate the most amount of power or heat avoids having localized heat spikes or locations of excessive heat generation in the IED 200 thereby improving the overall thermal management of the IED 200. In this way, the dual stage isolated power supply circuit 210 allows for power or heat dissipation to be spread over the two converters 310, 320, thereby reducing the thermal stress in any one component or any one location in the IED 200.

Figure 9:
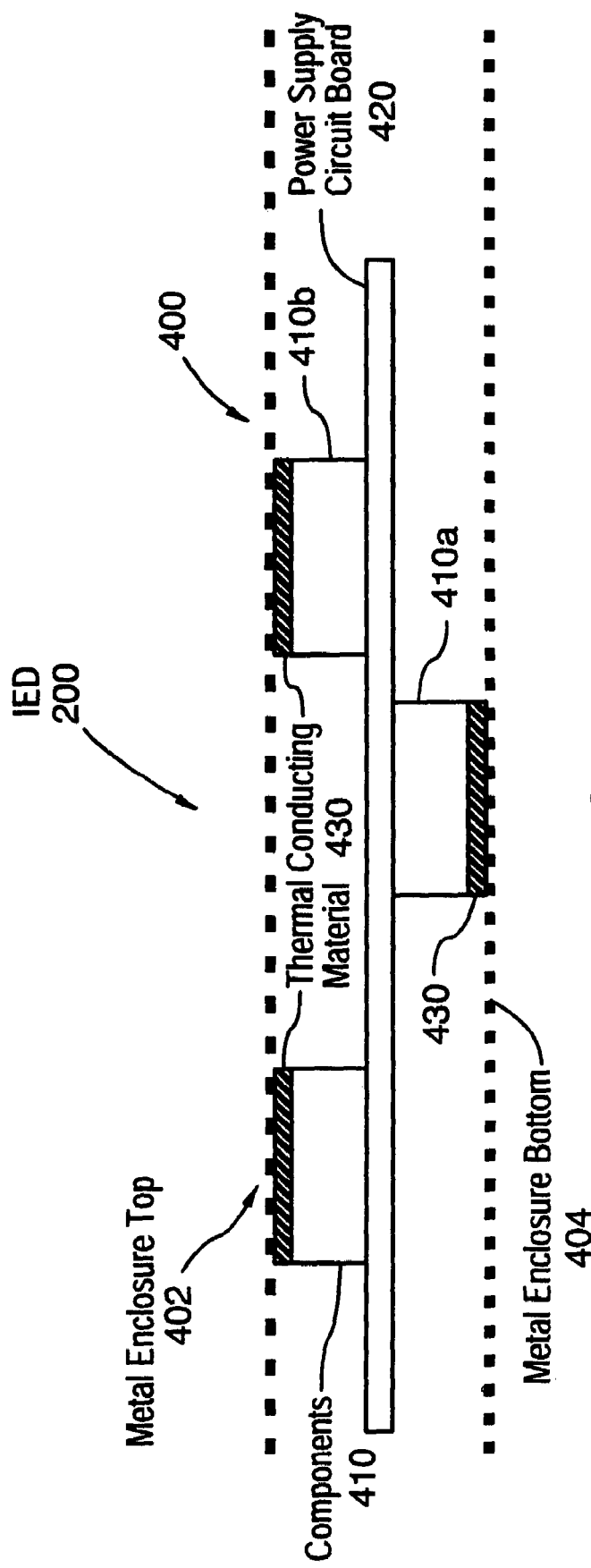
FIG. 9 illustrates a cross-section of a typical intelligent electrical device showing the physical placement of the first and second DC and DC converters with respect to the casing.

This is illustrated, for instance, in FIG. 9 which illustrates a symbolic cross-section of an IED 200 showing the placement of components 410a, 410b and 410c with respect to the power supply board 420 in the metal casing 400. As illustrated in FIG. 9, the components 410a, 410b and 410c are in thermal contact with the casing 400 by means of the thermal conducting material 430. In this way, the components 410a, 410b and 410c can be physically separated in the casing 400 of the ED 200 to avoid localized hot spots in the IED 200. Furthermore, the components 410a, 410b and 410c can also be in thermal contact with either the top side 402 or bottom side 404 of the metal casing 400 which also improves heat dissipation to the resulting environment.

More preferably, the two components which would generally create the most power/heat, namely the first DC to DC converter 310 and the second DC to DC converter 320 are preferably in thermal contact with different parts of the casing 400. For instance, it would be preferred if the component 410a may be the first DC to DC converter 310, which is shown to be in thermal contact with the bottom part 404 of the metal casing 400 and the second DC to DC converter 320 is the component 410b which is shown to be in thermal contact with the top part 402 of the casing 400. In this way, the power/heat generated by the overall decrease in the voltage of the power received from the external power source 180 from the received voltage VRE to the intermediate voltage VINT and then from the intermediate voltage VINT to the voltage Vc used by the internal component 204 can be dissipated by the top part 402 and the bottom part 404 in the metal casing 400 thereby improving heat dissipation. It is clear that by having the first DC to DC converter 310 and the second DC to DC converter 320 thermally mounted to separate parts 402 and 404 of the casing 400, the power/heat dissipation of the IED 200 would be greatly improved over, for example, having a single DC to DC converter (not shown) thermally connected to one part 402 or 404 of the casing 400.

In a further preferred embodiment, the component 410c may be another component which generates heat which must be dissipated. For instance, the component 410c may be one or more of the port isolation circuits 202 in thermal contact with the top casing 402. Accordingly, by employing a dual stage design having a first DC to DC converter 310 and a second DC to DC converter 320, the overall power dissipation of the power supply circuit 210 can be spread across the two stages, thereby spreading the thermal stress and reducing the thermal stress on any one component. Furthermore, components with the highest power/heat dissipation can be positioned on a circuit board 210 to be thermally mounted on the metal enclosure 400 of the IED 200 via thermally conductive materials 430 with low thermal resistance. This allows the entire metal case 400 of the IED 200 to be used as a passive heat sink. This is beneficial since the heat sink's ability to dissipate heat is proportional to its surface area and therefore the larger the surface area, the higher the heat dissipation capabilities. Thus, the entire enclosure is effectively a heat sink. Moreover, positioning the components both on the top and the bottom of the circuit board 210 such that they are in thermal contact with the top part 402 and bottom part 404 of the casing 400, facilitates avoidance of hot spots created on the enclosure 400 that could be harmful to the touch. Furthermore, spreading out the hot spots on the casing 400 improves heat dissipation and avoids adverse heat stresses in the IED 200.

Using this method, the present embodiment of the invention is capable of delivering in a preferred embodiment up to 25 watts of power from the external power source 180 to the internal components 204 over a temperature range of −40° C. to +85° C. In this way, the device manufactured according to a preferred embodiment of the present invention can be approved according to UL/CSA safety requirements up to a maximum temperature of 85° C.

Figure 10:
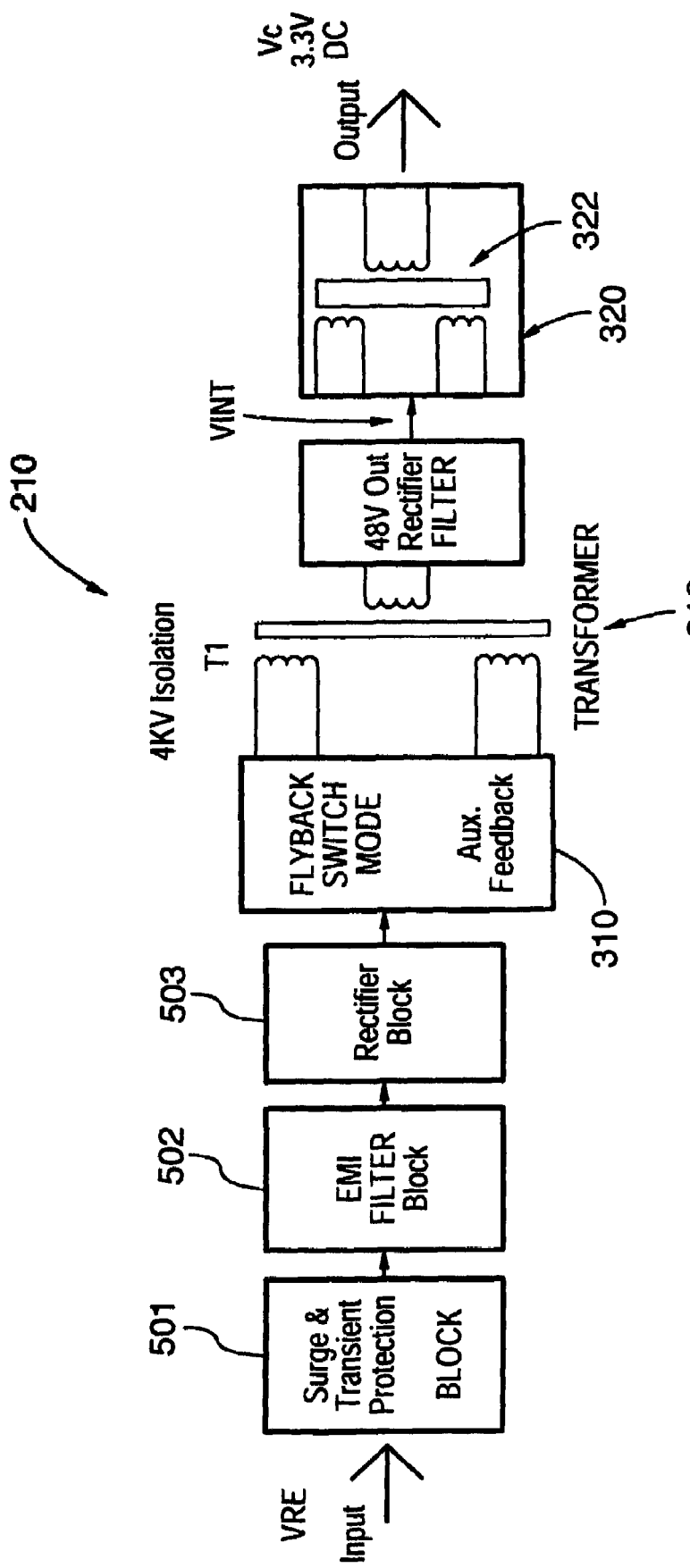
FIG. 10 illustrates a symbolic representation of a power supply circuit according to a further preferred embodiment of the invention.

FIG. 10 shows a further preferred embodiment of the present invention. As illustrated in FIG. 10, the power supply 210 in one preferred embodiment comprises a power input connection 280 to receive the power from the external source at the received voltage VRE. In a preferred embodiment, the received voltage VRE is in the range of 88 to 300 volts DC or 85 to 264 volts AC. The power supply circuit 210 comprises at a first stage a surge and transient protection block 501 for suppressing surges and transient signals which may exist in the power received from the external power source 180. The surge and transient protection block 501 is connected preferably to an electromagnetic interference (EMI) filter block 502. The surge and transient protection block 501 and the EMI filter block 502 together provide transient and EMI suppression. The surge and transient protection block 501 and the EMI filter block 502 may have a circuit similar to that shown and discussed above with respect to FIG. 3. Preferably, the surge and transient protection block 501 and the EMI filter block 502 will suppress both differential and common mode conducted electrical transients.

In a further preferred embodiment, after the EMI filter block 502, the power will pass through a rectifier block 503. The rectifier block 503 allows for the external power source 180 to be alternating current, if necessary. Therefore, the rectifier block 503 will operate in the case that the received voltage VRE is in the range of 85 to 264 Vac. Alternatively, the external power source 180 may be a DC power source such as, for example, a substation battery in the case where the power supply circuit 210 is used to supply power to an electrical device 200 located within a substation.

The rectified DC power, still at the received voltage VRE, is now received by the first DC to DC converter 310 comprising the first transformer 312. As illustrated in FIG. 10, the first DC to DC converter 310 is preferably a fly back switch mode having auxiliary feedback. The DC to DC converter will then convert the voltage of the received power from the received voltage VRE to the intermediate voltage VINT, shown in the preferred embodiment of FIG. 10 as being 48 volts. The first DC to DC converter 310 will also provide about 4,000 $V_{RMS}$ galvanic isolation as discussed above. The intermediate voltage VINT will then be further stepped down from the intermediate voltage VINT such as 48 volts DC to a voltage Vc which can be used by the internal components 204 of the electrical device such as the IED 200. The internal component voltage Vc is shown to be 3.3 volts DC in FIG. 10, but it is understood that it could be any other desired level, such as 5 volts or 2.2 volts DC, as may be required by the internal components 204 of the IED 200.

As illustrated in FIG. 10, and also according to a preferred embodiment, the first DC to DC converter 310 has a fly back topology. This was found to provide superior isolation characteristics and is preferred over other types of topologies in order to provide both a step down in the received voltage VRE to the intermediate voltage VINT and also provide superior galvanic isolation. Similarly, the second DC to DC converter 320 may also preferably implement a fly back topology and thus provide an additional stage of galvanic isolation.

Figure 11A:
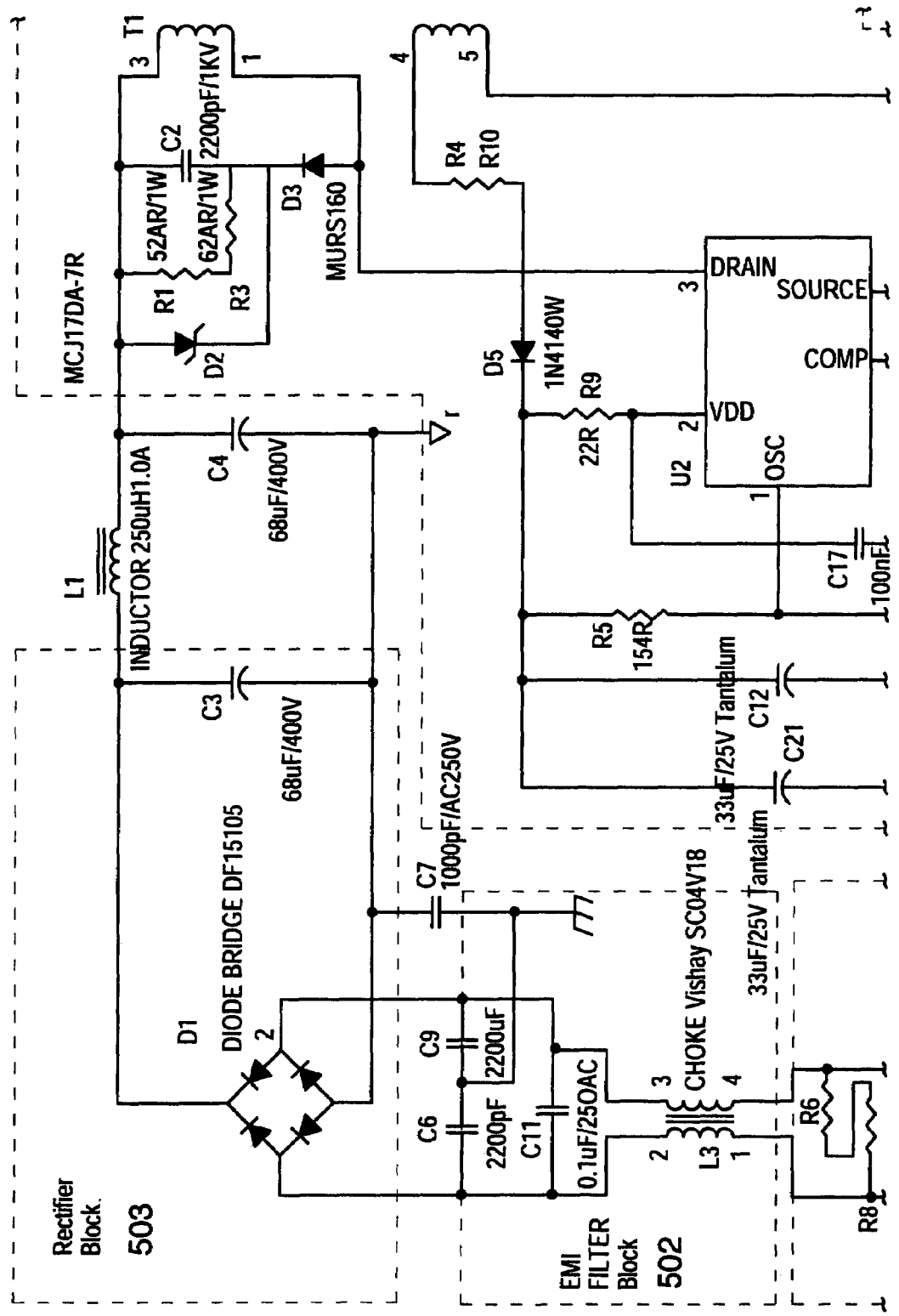
FIG. 11 illustrates a schematic diagram of a power supply circuit according to a further embodiment of the present invention.
Figure 11B:
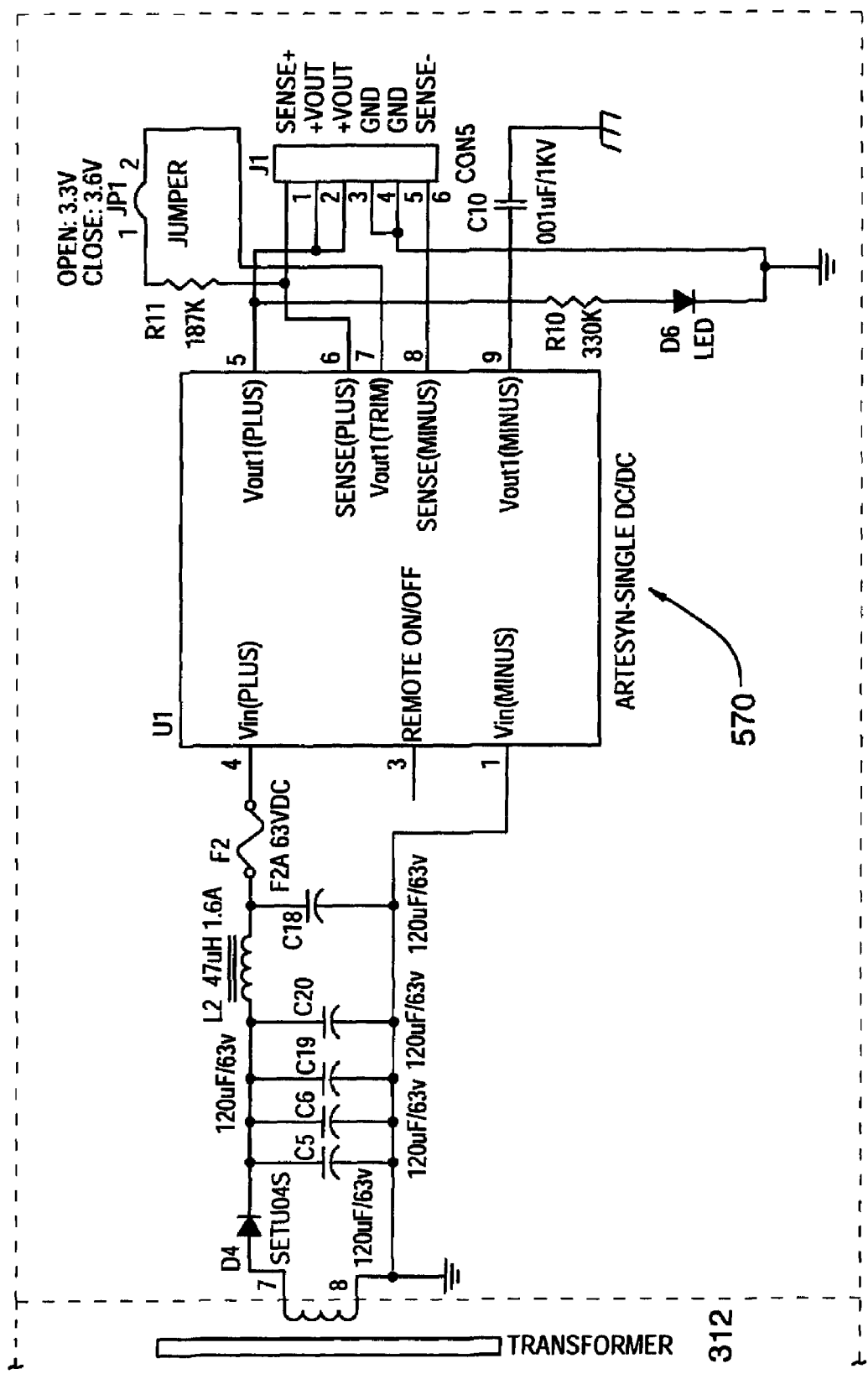
Figure 11C:
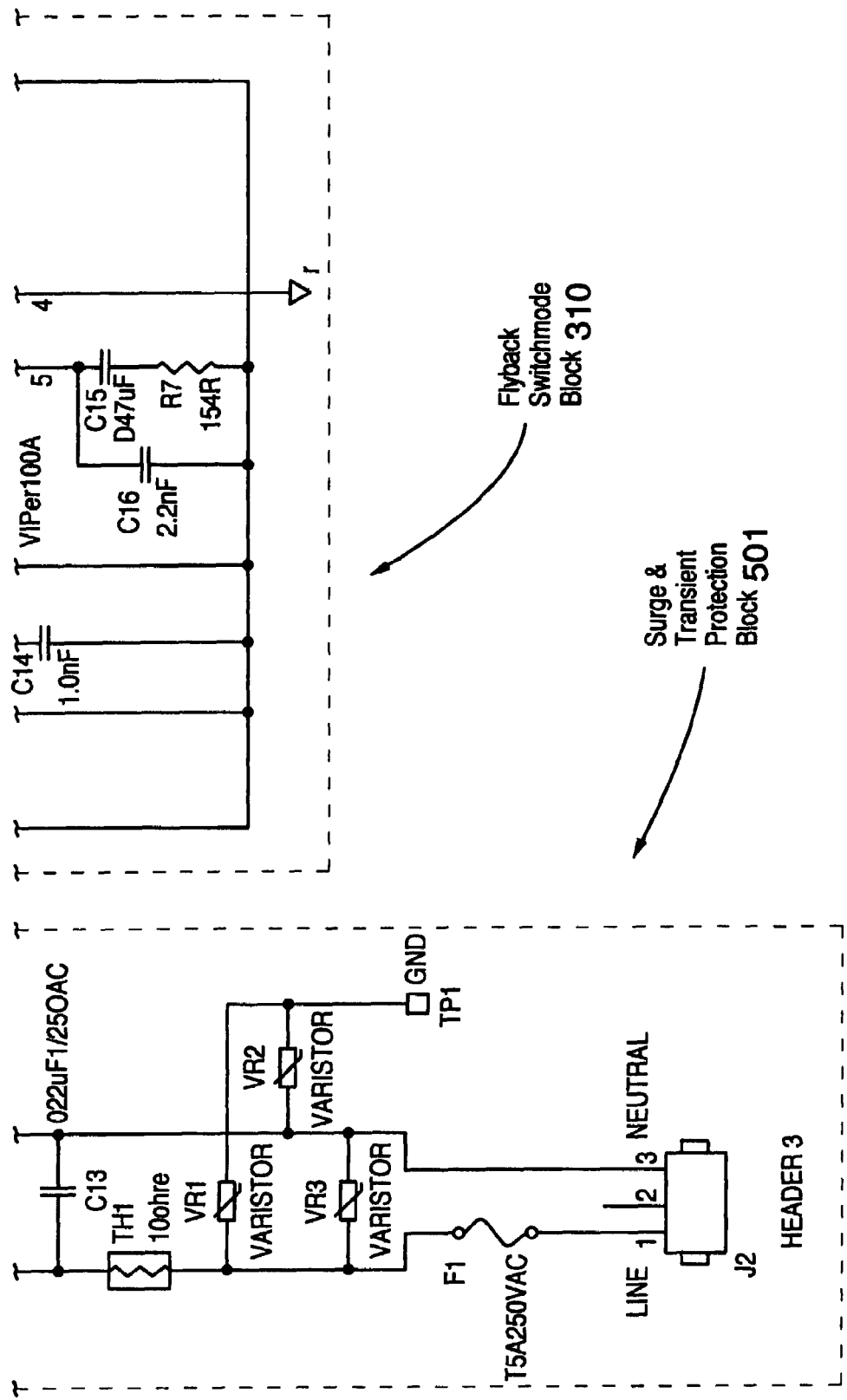

FIG. 11 provides a schematic representation of the power circuit 10 in more detail showing a schematic diagram of the specific components. As illustrated in FIG. 11, a surge and transient protection block 501 will have a combination of transistors and other components similar to that shown and discussed above with respect to FIG. 3. Similarly, the EMI filter block 502 will have a choke which also has functionality similar to that discussed above with respect to FIG. 3. The rectifier block 503 in this preferred embodiment comprises a diode bridge as is known in the art for rectifying alternate current and also provides a capacitor for filtering.

In one preferred embodiment, the surge and transient protection block 501 comprises varistor components VR1, VR2, VR3 and fuse F1. In operation, according to one preferred embodiment, suppression of common mode electrical transients is provided by varistor components VR1 and VR2 which will clamp any voltages exceeding a maximum allowed voltage range to within the maximum allowable operating voltage and shunt the resultant potentially dangerous transient currents from either LINE or NEUTRAL to ground (identified by connection TP1 and symbol GND in FIG. 11), respectively. If the transient conditions persist and if the transient currents exceed the threshold of fuse F1, then this will result in the fuse F1 blowing and disconnecting the LINE input from the remainder of the circuit. As illustrated in FIG. 11, the fuse F1 will generally be a 250 Vac fuse in one preferred embodiment. Furthermore, suppression of differential or transverse mode electrical transients across the LINE and NEUTRAL inputs is provided by varistor VR3. Again, if the differential transients persist, and the resultant currents exceed the threshold of fuse F1, then this will result in the fuse blowing and disconnecting the LINE input from the remainder of the circuit thereby preventing damage to the circuit.

In a preferred embodiment, the surge and transient protection block 501 may also comprise a thermistor, shown generally by reference thermistor TH1. The thermistor TH1 in one preferred embodiment provides inrush current (such as surge current) limiting. This inrush current or surge current may occur, for instance, after the transient protection suppression stage but prior to the EMI filter block 502. Furthermore, capacitor C13 may be provided for additional filtering of differential mode transients.

The output from the surge and transient protection block 501 may be connected to the EMI filter block 502 as illustrated in FIG. 11. The EMI filter block 502 provides filtering of common mode and differential mode electromagnetic interference (EMI) by one preferred embodiment, the circuitry comprises a common choke L3 and capacitors C8, C9 and C11. Filtering of the common mode EMI may be accomplished by the common choke L3 and capacitors C8 and C9 illustrated in FIG. 11. Filtering of differential mode EMI may be accomplished in one preferred embodiment by capacitor C11 and connected in parallel across the common choke L3.

The output from the EMI filter block 502 may be provided to the rectifier block 503 as illustrated in FIG. 11. The rectifier block 503 may comprise in one preferred embodiment the diode bridge D1, capacitor C3, inductor L1 and bulk capacitor C4. The rectifier block 503 rectifies AC voltages or reverse polarity DC voltages. In one embodiment, the diode bridge D1 will rectify both AC voltages and DC voltages of either polarity across capacitor C3. Inductor L1 then provides further filtering of the ripple current that may be riding on the rectified waveform which is then stored in bulk capacitor C4. Bulk capacitor C4 is the input to the next stage which is the flyback switchmode block 310. Capacitor C7 may also be provided to further filter differential mode transients to ground.

The flyback switchmode block 310 provides several functions to the overall power supply circuit 210 as also discussed above. These include stepping down the input voltage from the range of 88-300 Vdc or 85 to 264 Vac down to about 48 Vdc. This is accomplished, in one preferred embodiment, by utilizing a classic flyback converter topology primarily comprised of transformer T1 shown by reference numeral 312 in FIG. 11, which provides the energy storage function of an inductor, and integrated circuit U2 (VIPer100A) manufactured by ST electronics which provides the pulse width modulation circuit and MOSFET power switch required to create a flyback step-down switchmode power supply (SMPS) topology.

Furthermore, the flyback switchmode block 310 provides galvanic isolation. The galvanic isolation can be provided by way of transformer T1 also identified by reference numeral 312 which provides approximately 4000 Vrms of galvanic isolation between the primary and secondary windings shown by numbers 1, 3, 4, 5 (primary) and 7, 9 (secondary). In this way, the transformer 312 provides approximately 4000 Vrms of galvanic isolation in the first stage of the two-stage power supply according to one preferred embodiment of the present invention.

The output on the secondary side of transformer T1 is then rectified by diode D4 as well as capacitors C5, C6, C19 and C20. It is then further filtered by a low pass filter comprised of inductor L2 and capacitor C18 to remove high frequency switching noise caused by the switching nature of the flyback step-down switchmode power supply topology.

The output from the first stage of isolation, namely the flyback switchmode block 310, is then provided to the DC-DC converter block 320. The DC-DC converter block receives the 48 Vdc output voltage from the flyback switchmode block 310 and further steps to voltage down to between 5.0 Vdc or 3.3 Vdc as required by the internal components of the electrical device being powered. This will be provided for instance at the output between V out and ground GND. The DC-DC converter block 320 also provides an additional 1200 Vrms of galvanic isolation. Therefore, the DC-DC converter block 320 provides stage two isolation of the isolated power supply 210 of the present invention.

In one preferred embodiment, the DC-DC converter block 320 comprises a high-efficiency (such as 90%), isolated, DC-DC converter module, identified generally by reference numeral 570 in FIG. 11. In a preferred embodiment, the DC-DC converter module 570 is manufactured by Artesyn Technologies (trade name) and sold under the model name EXB30. In either case, the DC-DC converter module 570 generally comprises a second transformer (contained within the DC-DC converter module 570). The transformer containing the DC-DC converter provides additional 1200 Vrms of galvanic isolation. It is understood that other types of DC-DC converter blocks 320 may be provided. For instance, a further classic flyback SMPS topology, as illustrated in the flyback switchmode block 310 could also be provided for the DC-DC converter block.

While the present invention has been described in terms of an Ethernet switch 220, it is understood that the present invention can be implemented in any type of electronic device or intelligent electronic device 200. For instance, the present invention may be implemented in an intelligent electronic device 200 selected from a group consisting of switches, communication routers, Ethernet switches, gateways, video encoders, serial device servers, computers and modems. It is understood that the above list is not an exhaustive list of intelligent electronic devices which may implement the present invention, and it is also understood that further IEDs, not in existence today, may be developed in the future and could benefit from this invention. It is also understood that the present invention can also be used with other electrical devices such as media converters, fiber optical cable converters, fiber optical or electrical media converters.

Similarly, the present invention has been described with respect to IEDs 200 connected in a network 150 which, in the preferred embodiment, is an Ethernet switch. However, it is understood that any type of network can implement the present invention. For instance, the network 150 may be selected from the group consisting of fiber optical networks comprised of hubs, switches and fiber-to-electrical media converters, communication hubs, communication routers and switches having mixed fiber optical and electrical media ports as well as fiber optical and Ethernet networks comprised of hubs, switches, fiber-to-electrical media converters, serial to Ethernet servers, communication hubs, communication routers, computer hubs, computer network routers, switches and serial to Ethernet servers having mixed fiber optic to electrical media ports.

Utilizing the present invention will permit data packets to be transmitted reliably even in harsh environments. In other words, the environmentally hardened switch according to the present invention may facilitate providing zero packet loss even in environments in which other Ethernet switches would not function. This permits the Ethernet switch of the present invention to function for substantial periods of time without losing any data, which increases the efficiency and robustness of the entire system.

It will be understood that, although various features of the invention have been described with respect to one or another of the embodiments of the invention, the various features and embodiments of the invention may be combined or used in conjunction with other features and embodiments of the invention as described and illustrated herein.

Although this disclosure has described and illustrated certain preferred embodiments of the invention, it is to be understood that the invention is not restricted to these particular embodiments. Rather, the invention includes all embodiments, which are functional, electrical or mechanical equivalents of the specific embodiments and features that have been described and illustrated herein.

The embodiments of the invention in which an exclusive property or privilege is claimed are defined as follows:

1. In a network having at least two Intelligent Electronic Devices (IEDs) with at least one electrical connection between the at least two IEDs in the network, a circuit for providing power from an external source to internal components of an associated IED of the at least two IEDs and providing electrical isolation of the internal components, said circuit comprising:
   a power input connection for receiving power from the external source at a received voltage with respect to ground;
   a first DC to DC converter for converting the power from the received voltage to an intermediate voltage and providing a first level of isolation to the internal components of the IED;
   a second DC to DC converter for receiving power from the first DC to DC converter at the intermediate voltage and converting the power from the intermediate voltage to an internal voltage to be used by the internal components of the associated IED, and, providing a second level of electrical isolation to the internal components of the IED; and
   a port isolation circuit at the at least one electrical connection between the at least two IEDs providing a third level of isolation between the internal components of the at least two IEDs.

2. The circuit as defined in claim 1 wherein the first DC to DC converter is a flyback switch mode power supply type DC to DC converter; and
   the second DC to DC converter is also a fly-back switch mode power supply type DC to DC converter.

3. The circuit as defined in claim 1 wherein the first level of isolation is greater than the third level of isolation.

4. The circuit as defined in claim 3 wherein the first level of electrical isolation is 3000 to 5000 Volts Root Mean Square ($V_{RMS}$) and the third level of electrical isolation is between 1000 $V_{RMS}$ and 1400 $V_{RMS}$.

5. The circuit as defined in claim 1 further comprising port isolation circuits, at each electrical connection of each IED, for providing a third level of isolation between the internal components of the associated IED and another IED in the network, said third level of isolation being less than said first level of isolation.

6. The power supply circuit as defined in claim 1 wherein the first level of isolation is greater than the second level of isolation to protect the internal components of the IED from adverse electrical effects.

7. The circuit as defined in claim 6 wherein the adverse electrical effects include a ground potential rise of up to at least 5000 $V_{RMS}$ at a ground of at least one of the at least two IEDs in the network.

8. The circuit as defined in claim 7 wherein the adverse electrical effects include a ground potential rise of up to at least 6000 $V_{RMS}$ at one of the at least two IEDs in the network.

9. The circuit as defined in claim 8 wherein the second level of electrical isolation being about 900 $V_{RMS}$ and 1200 $V_{RMS}$.

10. The circuit as defined in claim 1 wherein the first and second DC to DC converters depend on their operation on energy stored in a magnetic field of a transformer.

11. The circuit as defined in claim 1 wherein the first DC to DC converter is thermally mounted to a first part of a casing of the associated IED and the second DC to DC converter is thermally mounted to a second part of the casing of the associated IED; and
    wherein the first part is separate from the second part.

12. The circuit as defined in claim 11 wherein the first part is on a first side of the casing and the second part is on a second side of the casing, different from the first side.

13. The circuit as defined in claim 12 wherein the casing provides a passive cooling of the first and second DC to DC converters such that operation is possible at an ambient temperature between −40° C. to +85° C. and at 25 Watts of power conversion.

14. The circuit as defined in claim 1 wherein the IED is selected from the group consisting of switches, communication routers, Ethernet switches, gateways, video encoders, fiber optic to cable converters, fiber optical to electrical media converters, serial to Ethernet gateways, media converters, serial device servers, computers and modems.

15. The circuit as defined in claim 1 wherein the network is selected from the group consisting of fiber optical networks comprised of hubs, switches and fiber-to-electrical media converters, communication hubs, communication routers and switches having mixed fiber optical and electrical media ports, and, fiber optical and Ethernet networks comprised of hubs, switches, fiber-to-electrical media converters, serial to Ethernet servers, communication hubs, communication routers, computer hubs, computer network routers, switches and serial to Ethernet servers having mixed fiber optic to electrical media ports.

16. The circuit as defined in claim 1 wherein at least one IED is located in an electrical power utility substation.

17. The circuit as defined in claim 1 further comprising:
    transient suppression circuitry connected between the power input connection and the first DC to DC converter for suppressing transient signals in the power from the external source.

18. The circuit as defined in claim 17 wherein the transient suppression circuitry comprises:
    a surge and transient protection component for suppressing surges and transient signals; and
    electromagnetic interference filter component for suppressing electromagnetic interferences in the power from the external source.

19. The circuit as defined in claim 1 further comprising:
a rectifier component connected between the power input connection and the first DC to DC converter for converting alternating current to direct current; and
wherein the power from the external source may be a direct current having a voltage between 88 V and 300 VDC or an alternating current between 85 and 264 $V_{AC}$.

20. In a network having at least two Intelligent Electronic Devices (IEDs), said network having at least one electrical connection between the at least two IEDs, a method for providing power from an external source to internal components of an associated IED of the at least two IEDs, said method comprising:
receiving power from the external source at a received voltage with respect to ground;
at a first DC to DC converter, converting the power from the received voltage to an intermediate voltage and providing a first level of isolation to the internal components of the IED;
at a second DC to DC converter, receiving power from the first DC to DC converter at the intermediate voltage and converting the power from the intermediate voltage to an internal voltage to be used by the internal components for the associated IED, and, providing a second level of electrical isolation to the internal components of the IED; and
at said at least one electrical connection between the at least two IEDs, a port isolation circuit providing a third level of isloaction between the internal components of the at least two IEDs.

21. The method as defined in claim 20 wherein the first DC to DC converter is a fly-back switch mode power supply type DC to DC converter; and
the second DC to DC converter is also a fly-back switch mode power supply type DC to DC converter.

* * * * *